*US006887339B1*

(12) United States Patent
Goodman et al.

(10) Patent No.: US 6,887,339 B1
(45) Date of Patent: May 3, 2005

(54) RF POWER SUPPLY WITH INTEGRATED MATCHING NETWORK

(75) Inventors: Daniel Goodman, Lexington, MA (US); Andrzej Bortkiewicz, Hamilton, MA (US); Gary D. Alley, Londonderry, NH (US); Stephen F. Horne, Chelmsford, MA (US); William M. Holber, Winchester, MA (US)

(73) Assignee: Applied Science and Technology, Inc., Wilmington, MA (US)

( * ) Notice: Subject to any disclaimer, the term of this patent is extended or adjusted under 35 U.S.C. 154(b) by 0 days.

(21) Appl. No.: 09/960,227

(22) Filed: Sep. 20, 2001

Related U.S. Application Data

(60) Provisional application No. 60/234,002, filed on Sep. 20, 2000.

(51) Int. Cl.[7] ........................... H05H 1/00; C23C 16/00
(52) U.S. Cl. ........................... 156/345.28; 156/345.48; 156/345.47; 156/345.41; 118/723 E; 118/723 I; 118/723 MW
(58) Field of Search ............................ 118/715, 723 I, 118/723 E, 723 MW; 156/345.48, 345.47, 345.41, 345.28

(56) References Cited

U.S. PATENT DOCUMENTS

| | | | |
|---|---|---|---|
| 2,981,902 A | 4/1961 | Familier | 333/17 |
| 3,509,500 A | 4/1970 | McNair et al. | 334/47 |
| 3,794,941 A | 2/1974 | Templin | 333/17 |
| 3,906,405 A | 9/1975 | Kommrusch | 333/17 |
| 4,095,198 A | 6/1978 | Kirby | 333/32 |
| 4,201,960 A | 5/1980 | Skutta et al. | 333/17 |
| 4,486,722 A | 12/1984 | Landt | 333/17 |
| 4,486,723 A | 12/1984 | Lysobey | 333/17 |
| 5,474,648 A | 12/1995 | Patrick et al. | 156/627.1 |
| 5,556,549 A * | 9/1996 | Patrick et al. | 216/61 |
| 5,565,737 A * | 10/1996 | Keane | 315/111.21 |
| 5,573,595 A * | 11/1996 | Dible | 118/723 MP |
| 5,643,364 A * | 7/1997 | Zhao et al. | 118/723 E |
| 5,654,679 A * | 8/1997 | Mavretic et al. | 333/17.3 |
| 5,670,881 A | 9/1997 | Arakawa et al. | 324/322 |
| 5,688,357 A | 11/1997 | Hanawa | |
| 5,815,047 A * | 9/1998 | Sorensen et al. | 333/17.3 |
| 6,020,795 A | 2/2000 | Kim | |
| 6,027,601 A | 2/2000 | Hanawa | |
| 6,211,745 B1 | 4/2001 | Mucke et al. | |
| 6,222,321 B1 | 4/2001 | Scholl et al. | |
| 6,229,392 B1 | 5/2001 | Porter et al. | |
| 6,311,638 B1 * | 11/2001 | Ishii et al. | 118/723 MW |

OTHER PUBLICATIONS

Fujita et al., "A 2–MHz 6–kVA Voltage–Source Inverter Using Low–Profile MOSFET Modules for Low–Temperature Plasma Generators," *IEEE Transactions on Power Electronics*, vol. 14, No. 6, Nov. 1999.

(Continued)

*Primary Examiner*—Parviz Hassanzadeh
(74) *Attorney, Agent, or Firm*—Proskauer Rose LLP

(57) ABSTRACT

The invention features an RF plasma generator. The RF plasma generator includes a variable frequency RF generator, comprising an H-bridge and an RF output. The RF generator generates electromagnetic radiation having a power. The RF plasma generator further includes a matching network that includes at least one variable impedance component. The matching network also includes a first port that is electromagnetically coupled to the output of the RF generator and a second port. The RF plasma generator also includes a load that is electromagnetically coupled to the second port of the matching network, and a plasma chamber for containing a plasma having a power. The plasma chamber is electromagnetically coupled to the load and receives electromagnetic radiation having a power from the load. Adjusting at least one of the frequency of the RF generator and the variable impedance component in the matching network changes the power in the plasma.

21 Claims, 19 Drawing Sheets

OTHER PUBLICATIONS

Raab, "Class–E HF Power Amplifier With Electronic Tuning and Modulation," *Int. Microwave Symp. Digest*, vol. 3, pp. 1513–1566, Phoenix AZ May 20–25, 2001.

El–Hamamsy, "Design of High–Efficiency RF Class–D Power Amplifier," *IEEE Transactions on Power Elecetronics*, vol. 9, No. 3, May 1994.

Koizumi et al., "Class DE High–Efficiency Tuned Power Amplifier," *IEEE Transactions on Circuits and Systems–I: Fundamental Theory and Applications*, vol. 43, No. 1, Jan. 1996.

Casey et al., "A High–Frequency, Low volume, Point–of–Load Power Supply for Distributed Power Systems," *IEEE Transactions on Power Electronics*, vol. 3, No. 1, Jan. 1988, pp. 72–82.

"An Intelligent Solution to RF Load–Power Variability,"vol. 2, No. 3, $3^{rd}$ Quarter (1995) pp. 1–8.

* cited by examiner

RF POWER SUPPLY WITH INTEGRATED MATCHING NETWORK

RELATED APPLICATIONS

This application claims the benefit of U.S. Provisional Patent Application Ser. No. 60/234,022, filed Sep. 20, 2000, the entire contents of which are hereby incorporated by reference.

FIELD OF THE INVENTION

The present invention relates generally to RF and microwave power supplies and to RF and microwave plasma processing equipment. In particular, the present invention relates to RF and microwave power supplies for generating RF or microwave plasmas in a plasma processing chambers.

BACKGROUND OF THE INVENTION

Radio Frequency (RF) or microwave power supplies (hereafter "RF power supplies") are widely used in semiconductor and industrial plasma processing equipment to generate plasmas in a process chamber. Plasma processing is used for a wide variety of applications, including etching of materials from substrates, deposition of materials on to substrates, cleaning of substrate surfaces, and modification of substrate surfaces. The frequency and power levels employed vary widely, from about 10 kHz to 2.45 GHz and from a few Watts to as much as 100 kW or greater. For semiconductor processing applications, the range of frequencies and powers presently used in plasma processing equipment is somewhat narrower, ranging from about 10 KHz to 2.45 GHz and 10 W to 30 kW, respectively.

Prior art RF power supplies used in plasma sources for plasma processing equipment generally have expensive and complex power generation and delivery systems. These plasma sources require a precision RF power generator, a power delivery system, a matching network, and metrology (measuring) equipment. In addition, precision instrumentation is usually required to control the actual power reaching the plasma The cost of these prior art RF power supplies can be a considerable fraction of the total system cost.

The impedance of plasma loads can vary considerably in response to variations in gas recipe, plasma density, delivered RF power, pressure and other parameters. The RF supply can deliver power to the plasma in a number of different ways. This can include inductive coupling via an antenna structure, capacitive coupling, launching a wave, exciting a resonant cavity, etc. The RF supply generally requires proper matching to the load impedance.

An antenna typically has a primarily inductive load impedance, with a smaller resistive component. In contrast, a sample holder or "chuck" typically presents a primarily capacitive impedance, also with a smaller resistive component. RF power can be delivered to these loads via an impedance matching network.

Most prior art RF generators for plasma processing equipment are designed to have a standard fifty-ohm output impedance. A matching network is required because the load represented by the process chamber and the plasma can vary widely and rapidly, causing mismatches in impedance between the standard fifty-ohm output impedance of the RF generator and the input of the load. A mismatch in the impedance of the generator and the plasma source causes great stress on electronics devices in the RF generator and the matching network and can cause premature failure because of either electrical or thermal stress or both.

Consequently, the reliability of prior art RF generators and matching networks is relatively low and is considered to be below desired standards of the semiconductor industry. The relatively low reliability increases the total cost of ownership (COO) of the plasma processing tool, since time must be spent in diagnosing failures and repairing or replacing defective RF equipment. Impedance mismatch also causes the power delivered to the plasma to vary, which can cause process inconsistency both within a chamber for successive substrates and among similar chambers.

Prior art matching networks are positioned in the power delivery system between the output of the RF generator and the input of the process chamber. The matching network provides a means of matching the output impedance of the generator to the input impedance of the process chamber. The matching network may contain fixed elements only, or it may contain elements such as variable capacitors and variable inductors, which can allow dynamic impedance matching of the generator to a changing load.

In recent years it has become common to use frequency tuning to carry out dynamic impedance matching. The matching network for dynamic impedance matching systems employing frequency tuning typically contains only fixed elements. Changes in load impedance can be accommodated by slightly varying the RF frequency. Dynamic impedance matching generally provides faster tuning speed, higher reliability, lower cost, and lower size. The dynamic tuning range, however, is relatively low.

A matching network having fixed reactive elements can be used to transform a reactive load to a load that appears purely resistive and can also be efficiently driven by a variable frequency RF supply. This approach, however, would typically require a very wide frequency range, e.g. +/−30%, because the load impedance can vary widely, e.g., +/−200%. Such a wide frequency range is unacceptable for processing reasons and also because of potential interference with other equipment protected using narrow-band filters.

A matching network of variable vacuum capacitors driven by servo-motors may accommodate a widely varying load. Mechanical motors, however, are relatively slow, while vacuum variable capacitors are expensive.

An approach for faster mechanical tuning is described in U.S. Pat. No. 5,654,679 to Mavretic, et al. This approach employs PIN diodes or relay switches to add or remove capacitors as participants in a matching network to maintain a somewhat constant load impedance, as presented to the RF supply.

This approach has several disadvantages. The matching network is complex because it requires many switches. PIN diodes are susceptible to breakdown and are relatively expensive. Switching is performed in a discontinous fashion; a PIN diode or relay has a binary state - either on or off. This can cause discontinous jumps in the resonant frequency and impedance seen by the RF supply, as well as off-resonance operation of the RF supply while the resonant frequency is re-established by a feedback control loop. Off-resonance operation can cause significant stress on field effect transistor ("FET") switches. Reduction of these problems requires, for example, use of many PIN diode switches, each requiring an associated capacitor and driving circuitry.

SUMMARY OF THE INVENTION

Various embodiments of the invention remedy many limitations encountered in prior art RF powered plasma systems. One embodiment provides a direct RF power supply, that is, a closely-coupled plasma processing system in which the RF power supply is co-located in a single unit with matching network components. The RF supply unit is located immediately adjacent to a load that delivers power to a plasma. The load may be, for example, an antenna or a substrate holder.

In a closely-coupled system, there is no need to employ a discrete, separate cable to connect an RF generator to a network or to the load of a plasma processing tool. Hence, potential instabilities due to cable selection are eliminated. Further embodiments eliminate use of mechanical components within an impedance matching network. This removes instability due to such components as motor-driven vacuum capacitors in the matching network.

Some embodiments employ power MOSFETs. Digital circuitry provides fast control of the phase of FET drivers to optimize efficiency, and reduce spurious harmonic content. Measurement and control of power and phase parameters in real time may support the control of plasma instabilities.

Attaching a semiconductor integrated circuit die to aluminum nitride or other high thermal-conductivity heat sinks may enhance high power performance. Hybrid packaging may further provide reduction of packaging inductance to enable higher power, higher frequency MOSFET operation. A system may further include fully shielded conductively-cooled inductors containing ferrite, powdered-iron or other high magnetic permeability material.

Some embodiments of a plasma system employ an H-bridge FET configuration in a frequency-variable RF amplifier, i.e. generator or RF converter, that may operate at or near a discrete frequency such as 13.56 MHz. (The H-bridge configuration employs semiconductor switches in groups of 4 in a circuit geometry such as shown in FIG. 9.) Digital control is provided for various H-bridge parameters, for example, frequency, power, driver phase, driver bias, circuit protection and auto-calibration features.

A close-coupled RF supply may provide lower cost and greater reliability in part through integration of generator, controls and matching systems into a single unit that includes no moving parts or external cabling. The system may match a capacitive load over a factor of six or more while requiring changes in frequency of less than 3.0%. The system may include series and parallel output capacitors and inductors that reduce an apparent load impedance change and a FET switch that electronically moves the center of the resonant frequency.

The system may fit in a unit with dimension 2"×13"×4"" or less volume. High permeability-loaded planar-structure inductors may be used to reduce inductor size and maintain a high quality factor (Q) with minimum distance to conductive walls. Planar heat sinks may also provide RF current return or RF shielding for a matching network portion of the system.

Accordingly, in a first aspect, the invention features an RF plasma generator. The RF plasma generator includes a variable frequency RF generator, comprising an H-bridge and an RF output. The RF generator generates electromagnetic radiation having a power. The RF plasma generator further includes a matching network that includes at least one variable impedance component.

The matching network also includes a first port that is electromagnetically coupled to the output of the RF generator and a second port. The RF plasma generator also includes a load that is electromagnetically coupled to the second port of the matching network, and a plasma chamber for containing a plasma having a power. The plasma chamber is electromagnetically coupled to the load and receives electromagnetic radiation having a power from the load. Adjusting at least one of the frequency of the RF generator and the variable impedance component in the matching network changes the power in the plasma.

The load of the RF plasma generator may be reactive. The matching network may transform the impedance of the reactive load to a substantially real impedance. The load may comprise an inductive load. The load may comprise a capacitive load.

Adjusting at least one of the frequency of the RF generator and the variable impedance component in the matching network may substantially match an impedance of the load to an output impedance of the RF generator. Adjusting may increase the power in the plasma.

The matching network may have a substantially resistive impedance, at a frequency of the electromagnetic radiation. The matching network may include a series combination of an amplifier and a variable capacitance capacitor. The variable capacitor may be electrically controllable.

Further, the RF generator and the matching network are physically integrated in a device housing. The RF plasma generator may further include a sensor that measures power delivered to the load.

At least one of the frequency of the RF generator and the variable impedance component in the matching network may be adjusted in response to a measurement of the sensor. At least one of the frequency of the RF generator and the variable impedance component in the matching network may be adjusted to minimize power reflected from the plasma. At least one of the frequency of the RF generator and the variable impedance component in the matching network may be adjusted to maximize power in the plasma.

The plasma may have a power that is related to the power of the electromagnetic radiation that is coupled from the load to the plasma. The matching network may include switching transistors.

In a second aspect, the invention features a method for stabilizing a plasma The method includes generating electromagnetic radiation with an RF generator that includes an H-bridge, the electromagnetic radiation having a power that is related to a DC voltage applied to an RF generator bus. The method further includes coupling the electromagnetic radiation to a plasma, sensing the power in the electromagnetic radiation generated by the RF generator and adjusting the DC voltage applied to the RF generator bus in response to the sensed power so as to maintain a substantially constant power in the plasma.

Sensing the power in the plasma may include measuring a voltage and a current of the electromagnetic radiation. The power may be maintained substantially constant with a time constant of less than 10 kHz.

In a third aspect, the invention features a method for stabilizing a plasma. The method includes generating electromagnetic radiation with an RF generator that includes an H-bridge, the electromagnetic radiation having a power that is related to a DC voltage applied to an RF generator bus. The method further includes coupling the electromagnetic radiation to a plasma, measuring an impedance of the load impedance and adjusting the DC voltage applied to the RF generator bus in response to the measured load impedance so as to maintain a substantially constant power in the plasma.

Sensing the change in the load impedance may include determining the rate of change of the power of the electromagnetic radiation with time.

In a fourth aspect, the invention features a method for stabilizing a plasma The method includes generating electromagnetic radiation with an RF generator that includes an H-bridge, the electromagnetic radiation having a power that is related to a DC voltage applied to an RF generator bus.

The method further includes coupling the electromagnetic radiation to a plasma, sensing a power of the plasma and adjusting the DC voltage applied to the RF generator bus in response to the sensed power of the plasma so as to maintain a substantially constant power in the plasma. Sensing the power of the plasma may include measuring optical radiation emitted by the plasma In a fifth aspect, the invention features a method for stabilizing a plasma. The method includes generating electromagnetic radiation with an RF generator that includes an H-bridge, the electromagnetic radiation having a power that is related to a DC voltage applied to an RF generator bus. The method further includes electromagnetically coupling the electromagnetic radiation to an impedance matching network, sensing a power of the electromagnetic radiation propagating through the matching impedance, coupling the electromagnetic radiation to a plasma and adjusting the DC voltage applied to the RF generator bus in response to the sensed power of the electromagnetic radiation propagating through the matching impedance so as to maintain a substantially constant power in the plasma.

In a sixth aspect, the invention features a method for stabilizing a plasma. The method includes generating electromagnetic radiation with an RF generator, coupling the electromagnetic radiation to a plasma, sensing a power related to the power in the plasma and adjusting an output impedance of the RF generator, in response to the sensed power related to the power in the plasma, to an impedance that maintains at least one plasma parameter at a substantially constant value.

The power related to the power in the plasma may include a power generated by the RF generator. The impedance that maintains a substantially constant power in the plasma may include a predetermined impedance. The power may be maintained substantially constant with a time constant of less than 10 kHz.

In a seventh aspect, the invention features an RF plasma generator. The RF plasma generator includes an RF generator. The RF generator includes an H-bridge and an RF output.

The RF generator generates electromagnetic radiation at a frequency. The RF plasma generator further includes a matching network having an impedance that is substantially resistive at the frequency of the RF electromagnetic radiation. The matching network includes a first port that is electromagnetically coupled to the output of the RF generator and a second port.

The RF plasma generator also includes a load that is electromagnetically coupled to the second port of the matching network and a plasma chamber for containing a plasma therein. The plasma chamber is electromagnetically coupled to the load. The RF generator may include a variable frequency RF generator.

In a eighth aspect, the invention features an RF plasma generator. The RF plasma generator includes an RF generator including an RF output that generates electromagnetic radiation at a frequency. The RF plasma generator also includes a matching network comprising a 3-port solid state device that controls a change of a capacitance of a component in the matching network, an impedance of the matching network being substantially resistive at the frequency of the RF electromagnetic radiation.

The matching network includes a first port that is electromagnetically coupled to the output of the RF generator and a second port. The RF plasma generator further includes a load that is electromagnetically coupled to the second port of the matching network and a plasma chamber for containing a plasma therein. The plasma chamber is electromagnetically coupled to the load.

In a ninth aspect, the invention features an RF plasma generator. The RF generator includes an H-bridge and an RF output, and generates electromagnetic radiation having a power. The RF plasma generator further includes a matching network comprising a series combination of an amplifier and a variable capacitance capacitor. The matching network includes a first port that is electromagnetically coupled to the output of the RF generator and a second port.

The RF plasma generator Further includes a load that is electromagnetically coupled to the second port of the matching network and a plasma chamber for containing a plasma having a power. The plasma chamber is electromagnetically coupled to the load, and receives electromagnetic radiation having a power from the load. Adjusting at least one of the frequency of the RF generator and the variable impedance component in the matching network changes the power in the plasma. The variable capacitance capacitor may be electrically controllable.

In a tenth aspect, the invention features an RF plasma generator. The RF plasma generator includes a variable frequency RF generator including an RF output that generates an RF signal having a power. The RF plasma generator also includes a matching network comprising at least one variable impedance component and a 3-port solid state device that controls a change of a capacitance of a component in the matching network. The matching network includes a first port that receives the RF signal and a second port.

The RF plasma generator also includes a load that is electrically coupled to the second port of the matching network and a plasma chamber for containing a plasma having a power. The plasma chamber is electromagnetically coupled to the load via the RF signal. Adjusting at least one of the frequency of the RF generator and the variable impedance component in the matching network changes the power in the plasma.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1A:
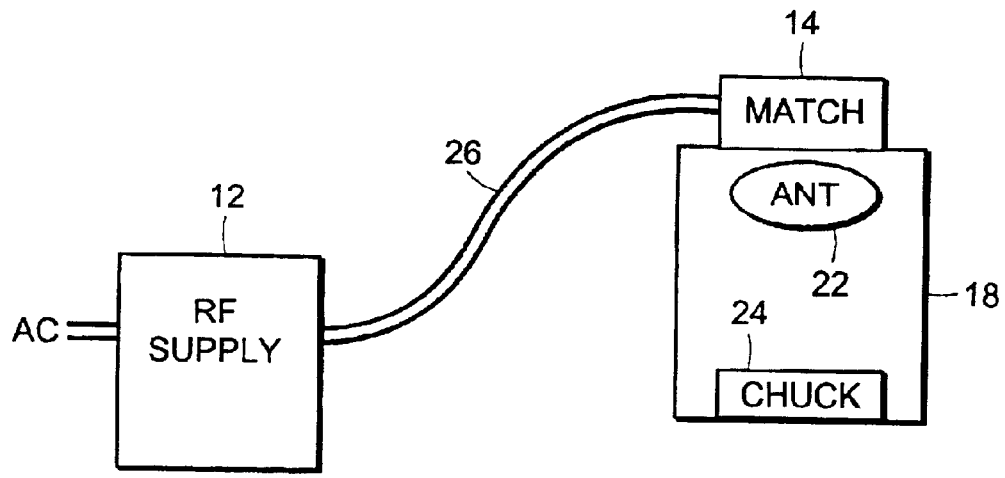
FIG. 1a illustrates a prior art plasma processing system that includes a separate RF generator and matching network.
Figure 1B:
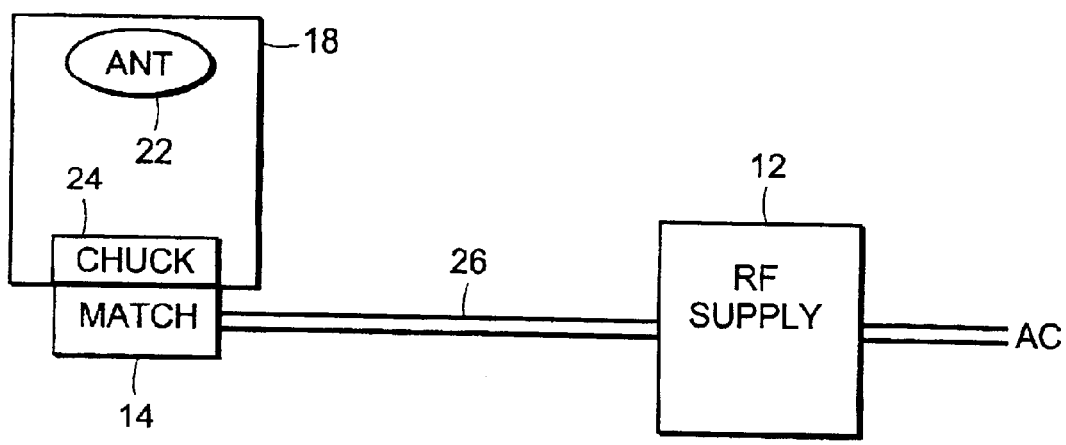
FIG. 1b illustrates a prior art plasma processing system that includes a separate RF generator and matching network.

FIGS. 1a and 1b illustrate prior art plasma processing systems that includes a separate RF generator 12 and matching network 14. A plasma processing system includes an antenna 22, a chuck 24 for holding substrates to be processed and a process chamber 18. The matching network 14 is positioned proximate to the antenna 22 or the chuck 14, depending on the processing system configuration.

The RF generator 12 is positioned a significant distance away from the process chamber 18, where a plasma is created. RF cables 26 connect the output of the RF generator 12 to the input of the matching network 14. Other prior art plasma processing systems enclose the matching network 14 and RF generator 12 in the same enclosure in order to save space. The combined unit may be located either remote from the process chamber 18 or proximate to process chamber 18. The output of the matching network 14 is attached to an antenna 22 that is designed to create a plasma in the plasma source 16. Some prior art plasma processing systems attach the output of the RF generator 12 to the chuck 24. Other prior art systems attach the RF generator to other types of power delivery systems including direct or capacitively coupled electrodes located at the top or bottom of plasma chambers; helicon antennas; or resonant cavities.

The RF generators in these prior art systems typically present a standard fifty-ohm output impedance. The fifty-ohm output impedance must be transformed by the matching network 14 to an impedance that efficiently transfers power to the plasma load. The exact value of the plasma load impedance depends on a number of factors, including the impedance of the antenna 22 or the sample holder, i.e. the chuck 24.

The real part of the impedance seen by either the input to the antenna 22 or the input to the chuck 24 may range from values as low as 0.5 ohm to values as high as 50 ohms. For the antenna the real part of the impedance may vary from 10–20 ohms, while the reactive part varies by 10–20% over most of the process range. For the chuck the real part of the impedance may vary from 1–3 ohms, while the reactive part may vary by 500% over the process range. A conventional matching network used to match these loads to a standard fifty-ohm generator output impedance will have relatively high RF power loss in addition to its high cost, low reliability and slow response time.

The following section of the Detailed Description describes problems encountered, and solutions, in stable delivery of power to a load in a plasma processing tool. Subsequent sections of the Detailed Description describe various embodiments to illustrate various aspects of the invention that overcome these and other problems.

Plasma Stability—Various embodiments of the invention may reduce fluctuations associated with prior art systems due, for example, to RF cables or due to motor-driven vacuum capacitors in a matching network. A cable-related instability may be caused by use of a cable of incorrect length for the RF generator-to-matchbox connection. A transmission line (such as an RF cable) transforms an imperfect match to appear slightly capacitive or inductive at the RF generator, depending on length. The response of the RF generator to this condition and the resulting response of the plasma to the generator may cause fluctuations having a frequency in a range of 1 Hz to 10 kHz.

Adjustable frequency systems with fixed matching elements are subject to other instabilities. Various embodiments of the invention mitigate these other sources.

In one embodiment, the matching network and load for an H-bridge oscillator system corresponds to an LRC-resonant circuit. For a resonant circuit, the power delivered, for example, to a chuck load, is a maximum at the resonant frequency. Typically, the resonant frequency varies over time because the plasma load impedance changes with power.

Figure 2:
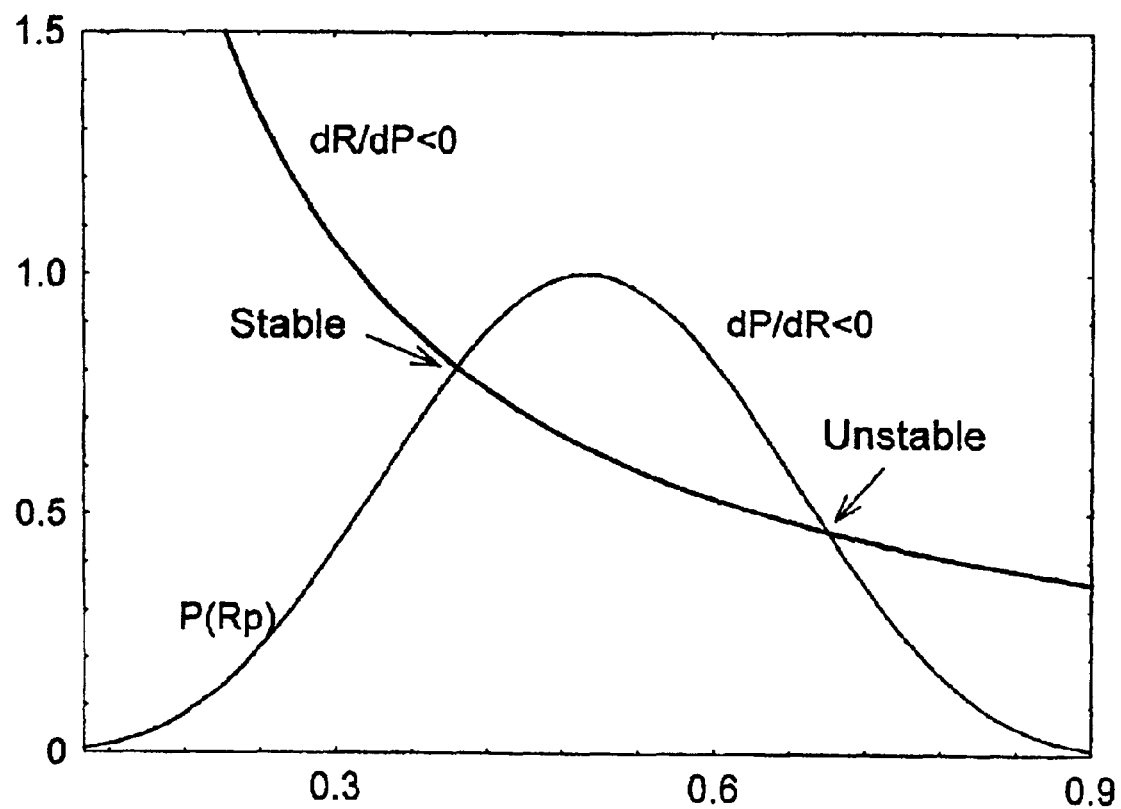
FIG. 2 is a graph that illustrates the plasma power and resistance for an embodiment employing an H-bridge oscillator system.

The graph of FIG. 2 illustrates typical relationships between the plasma power and resistance for an embodiment employing an H-bridge oscillator system. Curve P(Rp) illustrates power delivered as a function of plasma resistance at a given frequency (x-axis representing resistance as an independent variable). There will typically be a frequency where maximum power can be delivered, as shown in the curve. Curve Rp(P) illustrates plasma resistance as a function of power (y-axis representing power as an independent variable). Most plasmas have dRp(P)/dP<0, due to the decreasing electron collision frequency with increasing electron temperature. The intersections of the two curves represent the operating conditions of the system.

Stable operation requires the slope of the curves to have opposite sign at the operating point (i.e. dP/dR>0).

In some plasma recipes, especially those produced from electronegative gasses such as $SF_6$, $O_2$, $NF_3$ or $CF_4$, the slope of the Rp(P) curve in some parameter regimes have the opposite sign than shown in FIG. 2 (i.e. dR/dP>0). A stable operating point for these recipes will have dP/dR<0.

Figure 3A:
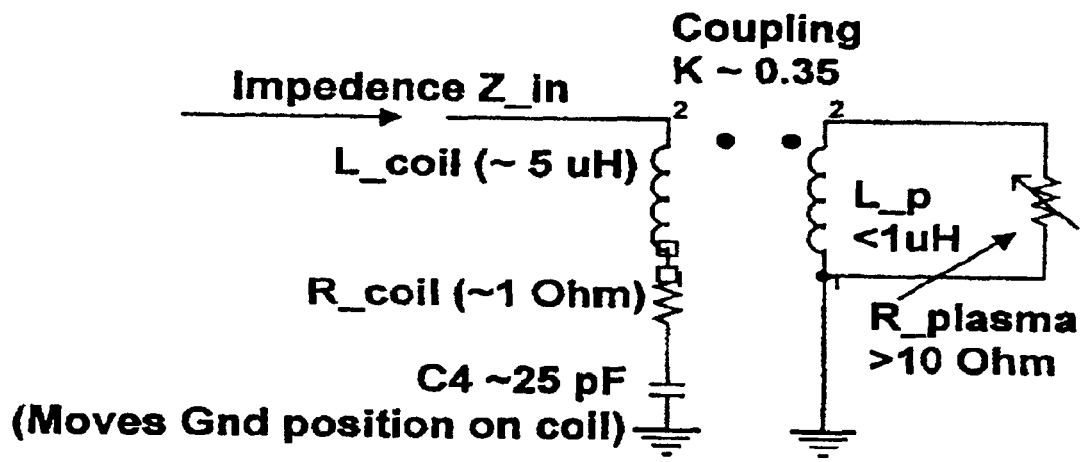
FIG. 3a is a schematic diagram that illustrates the coupling of an antenna and a plasma.
Figure 3B:
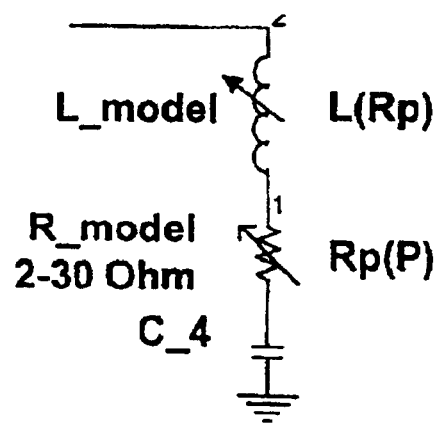
FIG. 3b is a schematic diagram that illustrates the coupling of an antenna and a plasma.
Figure 4:
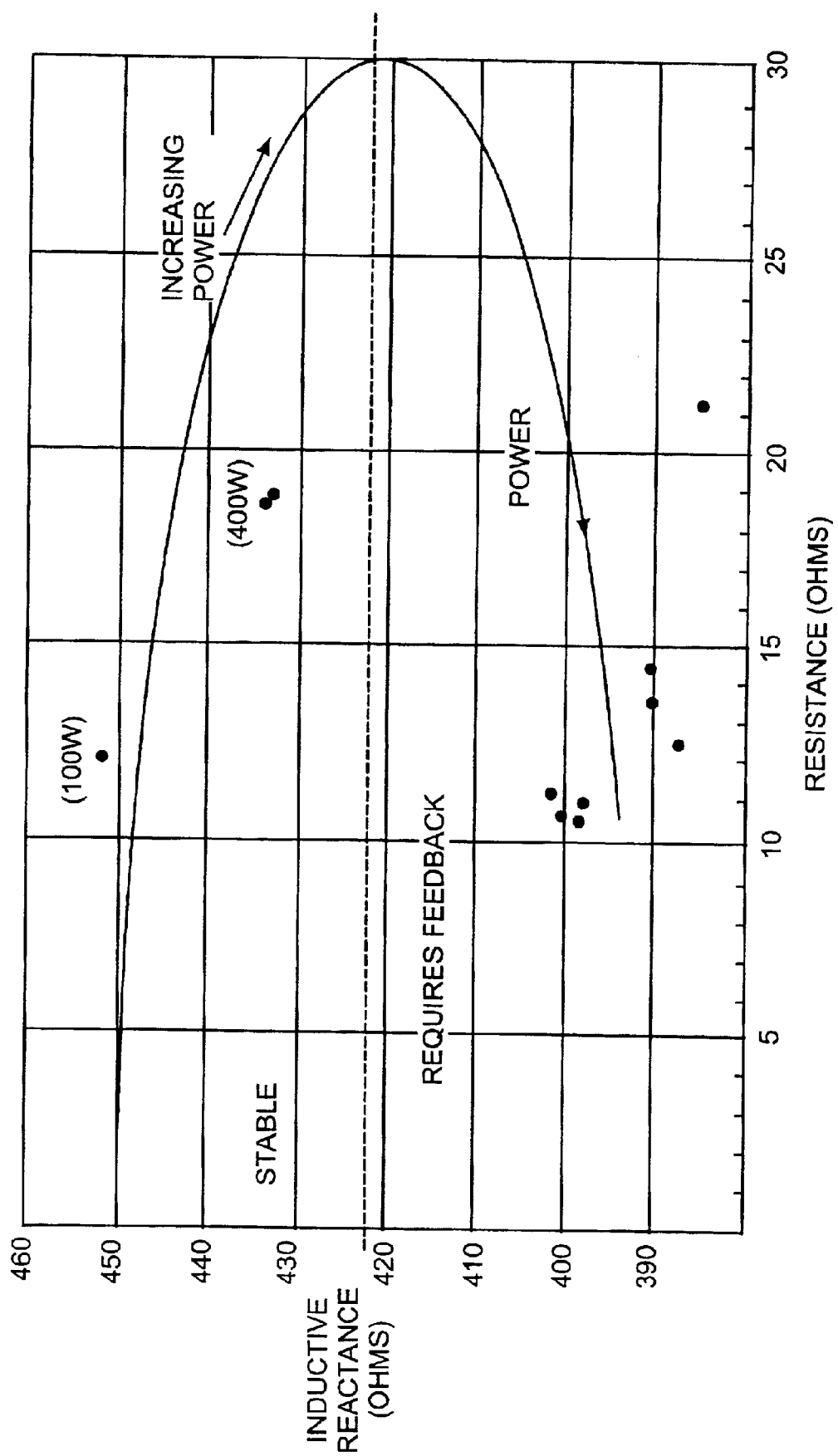
FIG. 4 is a graph that illustrates the reactive and resistive components of an input impedance of one embodiment.

Referring to FIGS. 3a, 3b and 4, problems of plasma control are further illustrated for some embodiments of an inductively coupled plasma The schematic diagrams of FIGS. 3a and 3b illustrate an antenna as possessing an inductance, L_coil, and a resistance, R_coil. A capacitor, C4 of value approximately 25 pF adjusts the ground of the coil. In FIG. 3a, the plasma is modeled as having inductance in parallel with resistance, while in FIG. 3b, the plasma is modeled as having inductance in series with resistance.

The models illustrated in FIGS. 3a and 3b have the same input impedance. The graph shown in FIG. 4 illustrates the reactive and resistive components of the input impedance, for L_coil=7.5 uH and a coupling to the plasma of k=0.3. As the delivered power increases, the real resistance first increases, and then decreases. Thus, at relatively low power, power increases with increasing resistance, while at relatively high power, power decreases with increasing resistance. For a low impedance H-bridge based supply, for example, operation in the lower portion of the curve requires feedback for stable operation without plasma oscillations.

Figure 5:
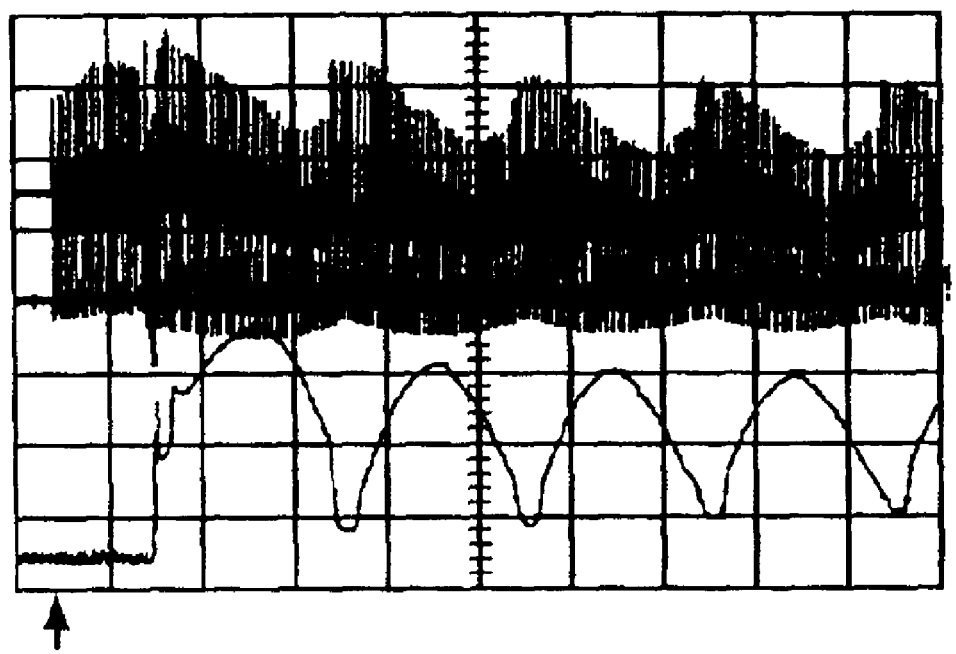
FIG. 5 illustrates an oscilloscope display of a plasma response to a change in RF frequency (lower trace) and RF voltage (upper trace).

Referring to FIG. 5, the plasma generally will not respond instantly to moderate changes in RF supply frequency or power. Response time is, for example, on the order of 1 msec. The bottom trace in the oscilloscope display of FIG. 5 illustrates a plasma response to a change in RF frequency, measured by plasma light output, of approximately 50% per msec. The upper trace shown in FIG. 5 is the RF voltage. Various embodiments, some of which are next described, may provide a power-leveling control scheme with a loop speed of at least 1 kHz to compensate for the delayed response of the plasma.

Figure 6A:
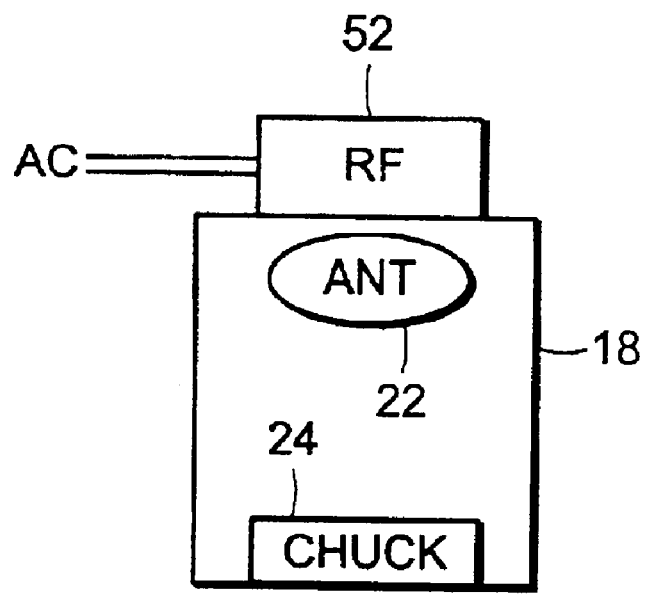
FIG. 6a illustrates an embodiment of a plasma processing system that includes a closely-coupled RF supply according to the present invention.
Figure 6B:
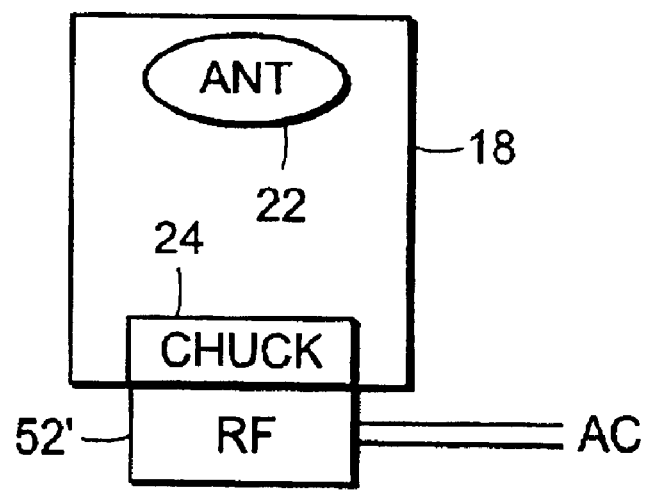
FIG. 6b illustrates an embodiment of a plasma processing system that includes a closely-coupled RF supply according to the present invention.

Direct/Closely-Coupled RF Generator System—FIGS. 6a and 6b illustrate plasma processing systems that include integrated RF plasma generators according to the present invention. The plasma processing system illustrated in FIG. 6a includes an RF generator 52 having an integrated matching network. The RF generator 52 is closely-coupled to an antenna 22. The plasma processing system illustrated in FIG. 6b includes an RF generator 52', also having an integrated matching network. The RF generator 52' is closely-coupled to a chuck 24. In some embodiments, the integrated matching network comprises a Resistance Stabilization Network (RSN) that includes passive impedance matching elements, such as capacitors and inductors. The RSN may also include an electrically controllable element such as a variable capacitor. Resistance Stabilization Networks are described further in connection with FIG. 7.

In one embodiment, the integrated matching network uses frequency tuning to match the output of the RF generator 52, 52' to the load impedance. The RF generator 52, 52' is designed to have an output impedance that is at or near the center of the impedance range presented by the plasma and the process chamber 18.

Figure 7:
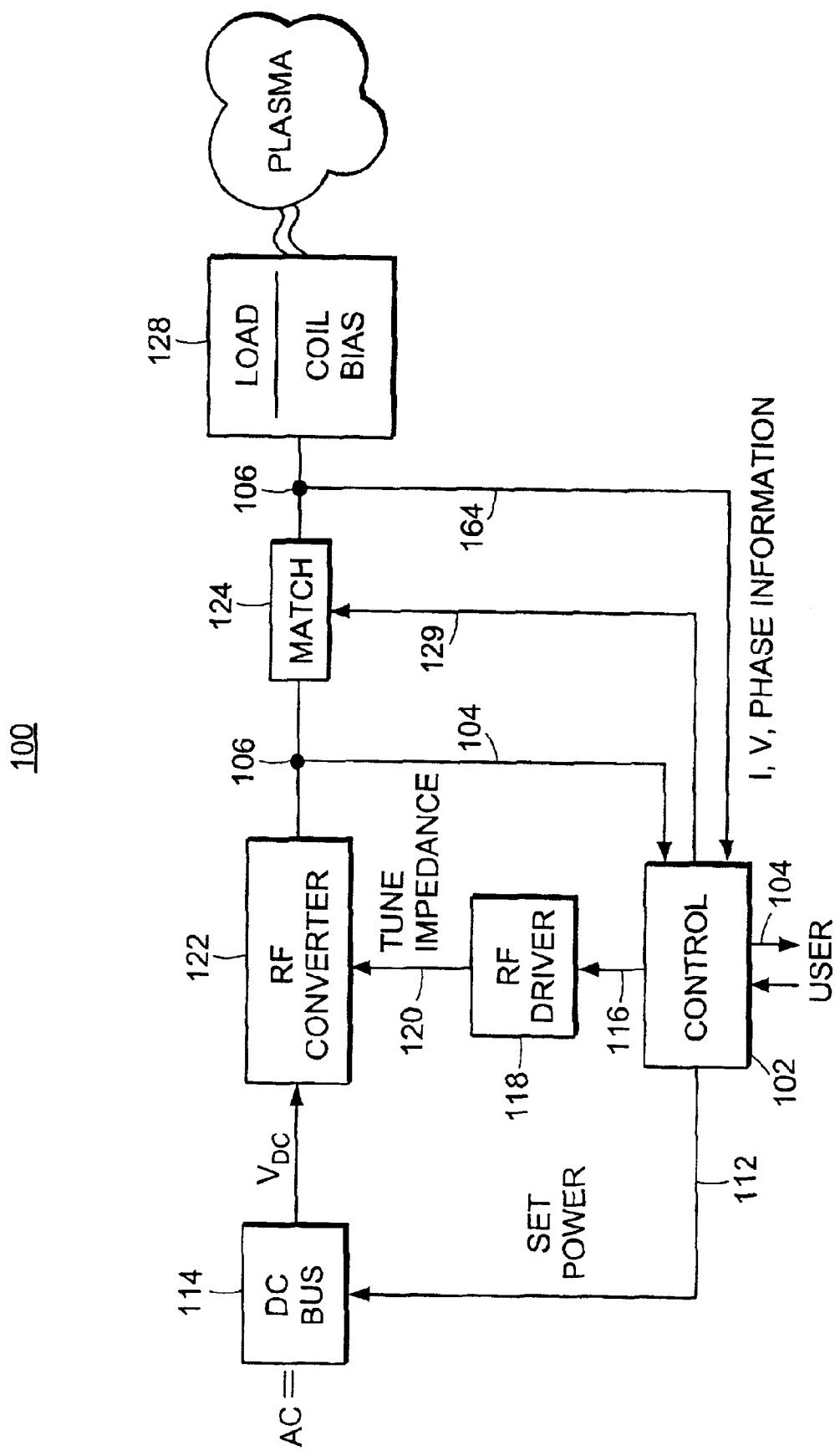
FIG. 7 is a block diagram that illustrates an embodiment of a plasma generation and control system according to the present invention.

FIG. 7 illustrates a block diagram of a plasma generation and control system 100 according to the present invention. The system 100 includes a processor 102 that has a user interface 104. The user interface 104 accepts control information from the user and provides information about the system to the user. The user interface 104 may be used, for example, to set system control parameters or to provide diagnostics and troubleshooting information to the user. In one embodiment, the user interface provides Internet communication between the system and users that may be either local to the operating environment or remote from the operating environment. The user interface 104 may also be used to modify and update software that controls the processor 102.

The processor 102 also has an inputs 104 that accepts signals from sensors 106 coupled to the input 108 of the plasma load 110. The processor 102 has an output 129 that is electrically or optically connected to matching network 124 in order to control the switchable elements in the network. The sensors 106 may be any type of electromagnetic sensor, such as sensors that measure forward or reflected RF voltage, current, power, and phase. The sensors 106 may also measure properties of the generated plasma.

The processor 102 has an output 112 that is electrically connected to a DC bus 114 of the system 100. The DC bus 114 is connected to a line voltage power supply (not shown) that powers the system 100. The DC bus 114 and line voltage power supply may be remotely located relative to the plasma source or may be located in a single box at the plasma source. The processor 102 generates signals that control the voltage on the DC bus 114.

The processor 102 has an output 116 that is electrically connected to an input of an RF driver 118. The RF driver 118 generates signals for RF conversion. An RF converter 122 is electrically coupled to the output of the RF driver 118 and to the DC bus 114. The RF converter 122 includes resonant circuits that generate RE radiation for establishing the plasma The DC voltage applied to the RF converter 122 from the DC bus 114 and the waveform provided to the RF converter 122 by the RF driver 118 determine the power and frequency of the RF radiation generated by the RF converter 112. The processor 102 varies the DC voltage on the DC bus and the characteristics of the waveforms generated by the RF driver 118 to achieve the desired RF radiation. One advantage of the integrated RF plasma generator and matching network of the present invention is that the RF power can be directly controlled by varying the voltage on the DC bus.

In one embodiment, the RF converter 122 includes an H-bridge architecture that is similar to a switching power supply. The H-bridge architecture includes a block of four Field Effect Transistor (FET) switches. The RF driver 118 generates a train of voltage pulses. These pulses are applied to a resonant circuit in the RF converter 122 that generates a sinusoidal RF output. In one embodiment, the RF converter 122 includes a phase-locked-loop that uses frequency tuning to cause the RF frequency to be varied in order to adjust the output impedance of the RF converter 122 in combination with the matching networking 124 to the input impedance of the plasma load as describe in connection with the H-Bridge control circuit of FIG. 8.

The output frequency can range in this architecture from approximately 10 KHz to over 1 GHz, at output power levels from approximately 10 W to approximately 30 kW. The processor 102 uses a digital control circuits to accurately control the FET's in the H-bridge circuit. The processor 102 may control the frequency of the FET's, the pulse width of the FET's, and the relative phase of the FET's. The H-bridge architecture is described further in connection with FIG. 8.

One advantage of the integrated RF generator of the present invention is that the output impedance of the RF converter can be varied and full power can be delivered to a wide range of real loads. This is in contrast to most prior art RF generators for plasma processing equipment that present a standard fixed fifty-ohm output impedance.

The output impedance of the integrated RF generator of the present invention can be varied by changing the frequency of the pulse train generated by the RF driver 118. Changing the frequency of the pulse train generated by the RF driver 118 will cause both the frequency of the RF radiation generated by the RF converter 122 and the output impedance to vary. The output impedance may also be varied by changing component values in the matching section 124. In operation, the processor 102 instruct the RF driver to change the frequency of the pulse train generated by the RF driver 122, or to change a capacitance in match 124.

In one embodiment, the RF converter 112 includes a temperature control unit. Any type of temperature control unit may be used. For example, the H-bridge and associated driver and control circuits may be packaged in a fluid-cooled hybrid module to improve heat dissipation. For example, the circuits may be copper bonded to a high thermal conductivity substrate (such as aluminum nitride). The substrate may then be bonded or fastened to a water-cooled heat sink. The water-cooled hybrid module can provide thermal characteristics that allow more than 10 kW of RF power to be generated from a single fluid-cooled hybrid module. In another embodiment, part of or the entire RF converter 112 is immersed in a coolant, such as the 3M Fluorinert coolant.

Another advantage of the integrated RF plasma generator of the present invention is that an integrated RF plasma generator of the present invention may have higher reliability compared with prior art RF generators. Higher reliability, in part, may arise from elimination of cables, reduction in number of components and a more accurate method of measuring power delivered to the plasma. This may increase plasma processing repeatability.

In one embodiment, a matching network 124 is coupled to the output of the RF converter 122. The matching network 124 matches the output impedance of the RF converter 122 to the center impedance of a load 128. The matching network 124 may include a network of inductors and capacitors. It may also contain a ferrite-core transformer with an appropriate turns ratio. The ferrite-core transformer is advantageous because it provides isolation to ground.

In one embodiment, the matching network 124 is a Resistance Stabilization Network (RSN). The input impedance of the RSN matching network has only a resistive component at the operating frequency. RSN matching network are advantageous because they reduce the change in impedance of the load as seen by the RF supply.

In another embodiment, the matching network 124 contains switchable capacitive and/or inductive elements. These elements can be chosen to provide stability against plasma or system oscillations. In most cases, stable operation requires that additional power is supplied to the plasma when the plasma resistance increases. In some ranges of plasma and system parameters, stable operation requires that the delivered power decrease when the plasma resistance increases. By using switchable elements, the matching network 124 can operate in either mode.

The load 128 may include an antenna that inductively couples the RF radiation into the plasma discharge. The antenna may include an appropriate network of inductors and capacitors. In one embodiment, a substrate holder, i.e. chuck, is also powered by the plasma generation system 100. The substrate holder may include a transformer to match the load.

One advantage of the integrated RF plasma generator and matching network of the present invention is that the RF plasma generator and matching network is physically located close to the load. This is in contrast with most prior art RF power supplies for plasma processing equipment that are remotely located relative to the plasma source. This reduces space and overall cost of the system.

Figures 8, 8A:
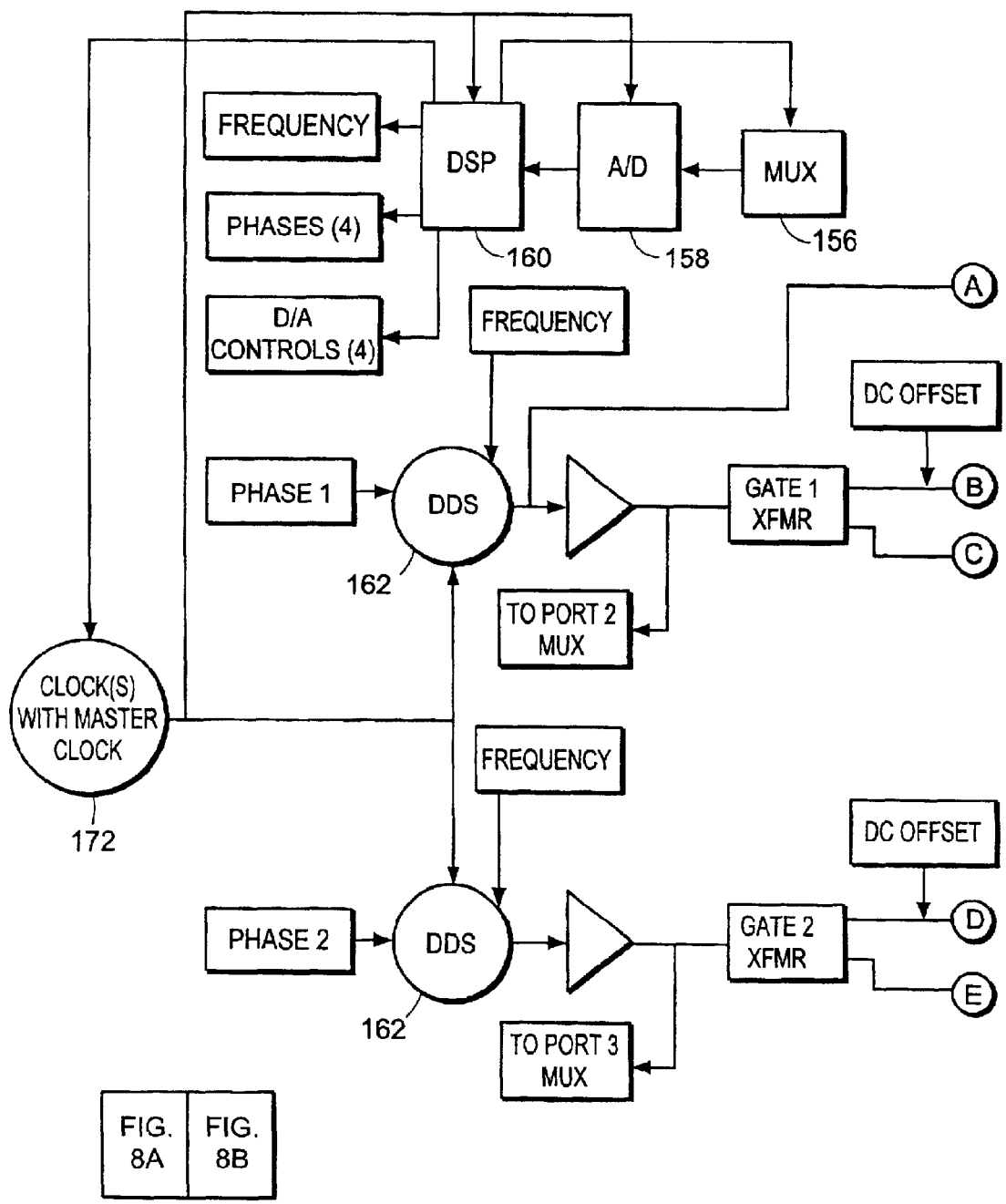
FIG. 8A and FIG. 8B illustrate an embodiment of an H-bridge control circuit for the RF converter of FIG. 7.
Figure 8B:
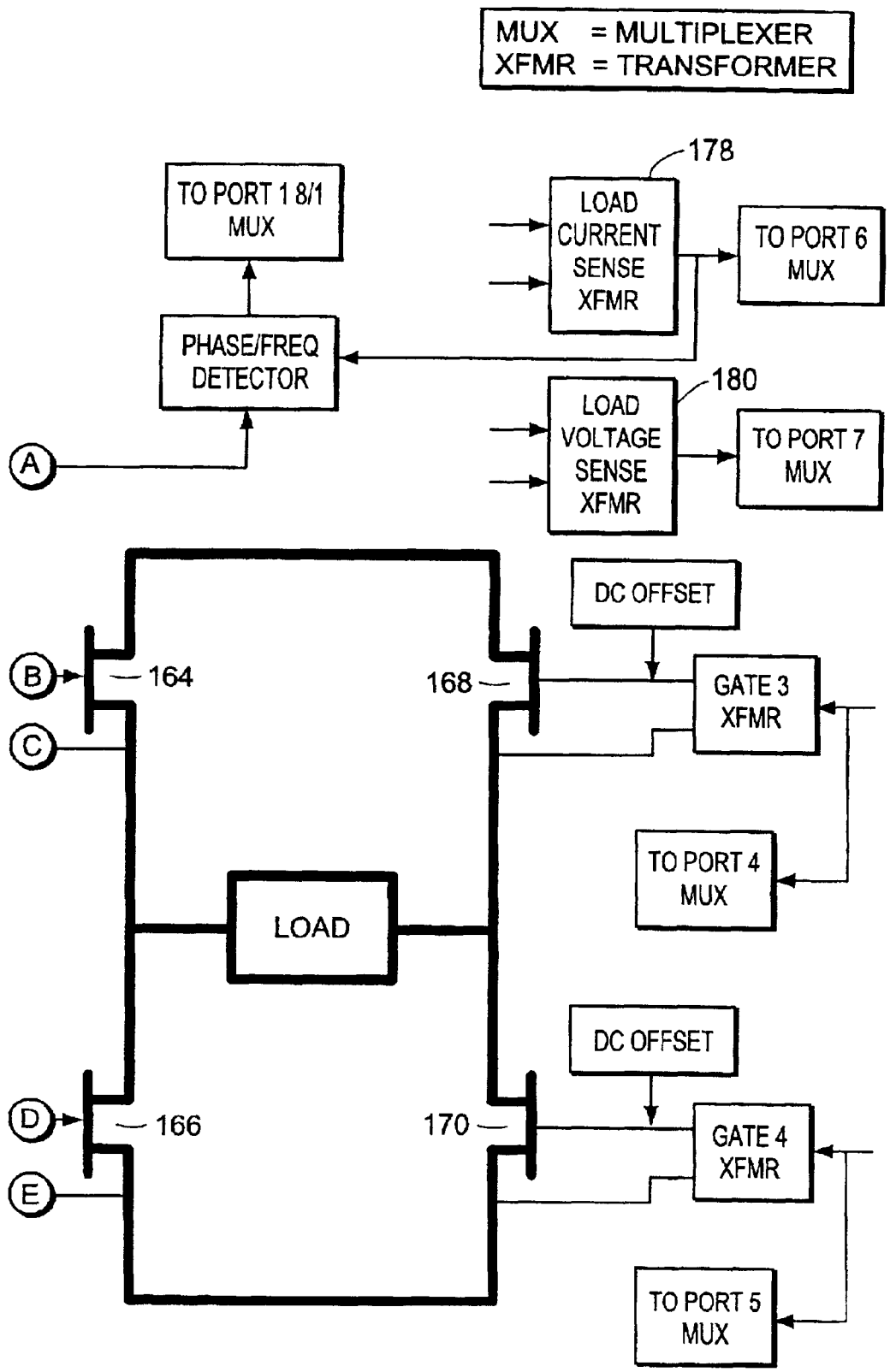

FIG. 8 illustrates an embodiment of the H-Bridge control circuit 150 for the RF converter 122 of FIG. 7. The control circuit 150 performs three separate functions. First, the control circuit 150 controls the frequency of the H-Bridge so that it is compatible with the frequency of the plasma load. Second, the control circuit 150 controls the relative timing (signal phase) of signals applied to the gates of the H-Bridge MOSFET's so that the switching occurs at the desired time. Third, the control circuit 150 controls the duty cycle of the signals applied the gates of the MOSFET's in order to minimize power dissipation and transients which would harm the devices. In one embodiment, the H-Bridge control circuit realizes these functions using Digital Signal Processor (DSP) with associated A/D conversion, Direct Digital Synthesis (DDS), a matrix switch (a switch containing multiple input and output ports) and sampling hardware as described below.

The H-Bridge control circuit 150 controls the frequency of the RF signal using a phase locked loop (PLL) to lock the RF signal frequency to the resonant frequency of the plasma load. The voltage across the H-Bridge load port. The sampled voltage may be switched through to a multiplexer 156, which is connected to an A/D converter 158. The voltage may also be switched though a matrix switch. In one embodiment, the A/D converter 158 is a 12 bit A/D converter and the sampling rate is approximately 60 MHz.

The output of the A/D converter 158 is connected to a DSP circuit 160. The DSP circuit 160 implements the PLL using a PLL algorithm. A DDS circuit 162 generates the frequency control words and provides these signals to gate two 166, gate three 168, and gate four 170. The phase of the DDS signal controls the phase of the signal at each of the gates. This ensures that the frequencies driving each gate are substantially identical at all times.

The A/D converter 158 may be operated at a high sample rate to acquire data, or at a low sample rate. When operated at a low sample rate, the acquired signal may be aliased. The sample rate may be independent of a master clock, or a fixed ratio of the master clock. An RF converter operating frequency may be a fixed ratio of the master clock, or a variable ratio of the master clock.

In one embodiment, a master clock of one or more clocks 172 is varied in frequency, and an A/D converter and a DDS are operated at fixed ratios of the master clock. The ratios are chosen to prevent overlap of the aliased RF converter operating frequency and its aliased harmonics, at, for example, the ninth harmonic.

The DSP circuit 160 performs Fast Fourier Transforms (FFTs) on each of the four sampled data streams from each of the four gates. Since the phase of the output of the DDSs are known, the measurement of the phase of the fundamental component at the gate input indicates the phase shift between the DDS and the respective gate input. In one embodiment, gate one 164 and gate four 170 switch with a phase 180 degrees different than that at gate two 166 and gate three 168.

The phase difference can be precisely controlled because all phase measurements are made relative to a common DSP clock. The rate at which the phase control is updated can be relatively low, for example, the update rate may be 1 KHz rate. In one embodiment, the frequency control loop has a bandwidth on the order of approximately 100 KHz. The frequency will change rapidly with respect to the phase control updates. Since the delay between the DDS output and the gate of the MOSFET is a very slowly varying function of time, the phase will be updated appropriately as the DDS frequency is changed.

In one embodiment, the duty cycle of the signals applied to the gate are controlled by monitoring the magnitude and phase of the second harmonic gate voltage. When the duty cycle is 50%, the magnitude of the second harmonic is zero. The phase of the second harmonic provides information on whether the duty cycle is greater or less than 50%. This allows the user to set the duty cycle to any desired value including 50%. In one embodiment, the duty cycle is adjusted by varying the threshold using a D/A converter applied to a comparator.

In one embodiment, at least one of a plasma load current sensor 178 and the plasma load voltage sensor 180 are positioned at the RF input port of the plasma chamber. The sampled data from these sensors can be used to observe the RF power delivered into the plasma, the efficiency of the matching network, impedance of the plasma chamber, and the spectrum of the energy at the RF port of the chamber. These measurements can be updated at rates on the order of KHz. In another embodiment, the sampled data from load current sensor 178 and load voltage sensor 180 are used to control the switchable elements in matching network 124 to maintain stability.

The RF converter 122 using the H-Bridge control circuit 150 can efficiently generate and deliver RF power to a plasma load. Efficient power delivery is achieved when RF converter circuit 122 operates at the resonant frequency of the matching network 124. In one embodiment, the PLL is designed to provide commutation of the power transistors synchronized to the voltage at the input of the impedance matching network. Commutation of the current supplied by the transistors is in synchronization with the voltage and, therefore, no reflected power is present in the RF converter circuit.

In one embodiment, the PLL is designed to achieve Zero Voltage Switching (ZVS) operation of the power transistors. High electrical efficiency RF conversion (above 90%) can be achieved with ZVS operation of the power transistors.

Figure 9:
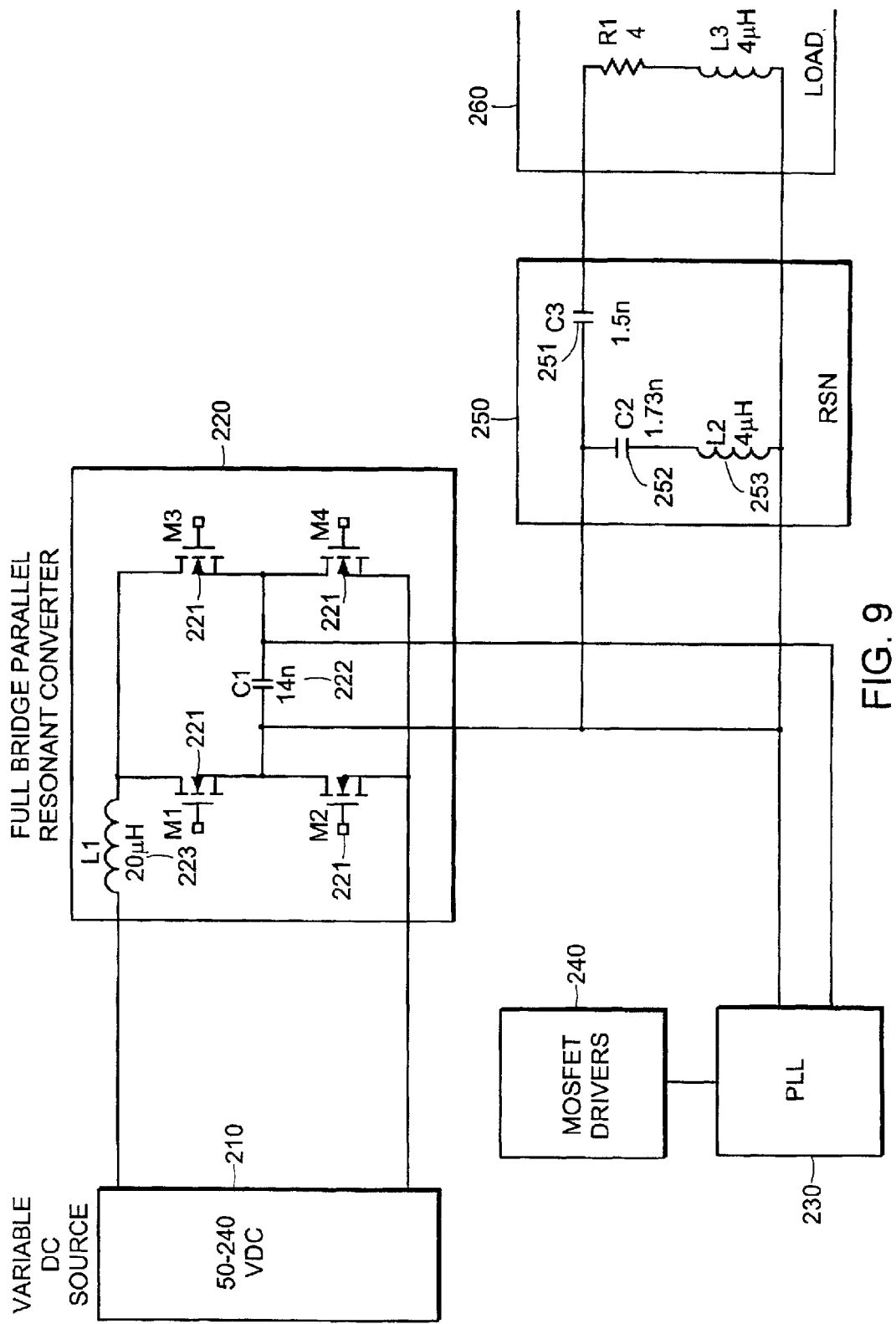
FIG. 9 is a schematic diagram of a plasma supply system that includes a resistance stabilization network, according to one embodiment of the invention.

Resistance Stabilization Network—Referring to FIG. 9, the following describes more detailed embodiments of an inductively coupled plasma source that includes a parallel resonant converter, an RSN and PLL control circuitry. In one embodiment, high efficiency of RF power delivery is achieved when the circuit operates at the resonant frequency of the output network. The input impedance of the matching network is purely resistive at this operating frequency.

The present embodiment includes a variable DC source 210 that supplies a full bridge parallel resonant converter 220. The converter 220 is controlled by a PLL control circuitry 230 that is driven by a driver circuit 240 that includes MOSFETs. The converter 230 is coupled to a load 260 via an RSN 250.

The converter 220 includes four FETs 221, a capacitor 222 and an inductor 223. The RSN includes a capacitor 251 in series with the load 260. For operation near 2 MHz, the capacitor 251 may have a value of 1.5 uF, and a second capacitor 252 in parallel with the load may have a value of 1.7 uF. The second capacitor 252 is in series with a second inductor 253, which may have a value of 4 uH. Operation at higher frequency will use smaller component values.

The PLL circuitry provides commutation of the power transistors synchronized to the voltage at the input of the impedance matching network. Commutation of the current supplied by the transistors is in synchronization with the voltage; thus, reflected RF power may be absent in the RF converter circuit. This embodiment may provide high electrical efficiency, for example greater than 90%, due to Zero Voltage Switching ("ZVS") operation of the power transistors. The PLL circuitry enables ZVS operation of the RF converter.

Figure 10:
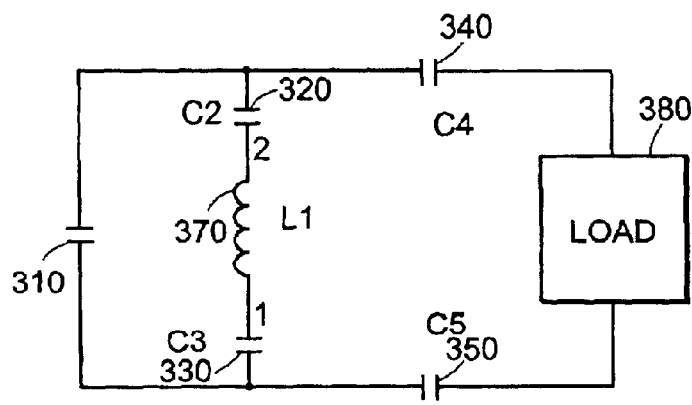
FIG. 10 is a schematic diagram that illustrates an embodiment of a resistance stabilization network.

Referring to FIG. 10, another embodiment of an RSN is described. This embodiment includes capacitors C1 310, C2 320, C3 330 and inductor L1 370 in parallel with a load 380, e.g., a chuck. Capacitor C4 340 and capacitor C5 350 are in series with the load. This embodiment reduces the effect of changes in the real component of the load on the impedance presented to the RF supply. Changes in the reactive component of the load may still be presented to the RF generator. Since the inductive reactance change scales linearly with frequency, this embodiment is best employed in implementations with operating frequencies less than approximately 13 MHz.

Frequency Control—In one embodiment, stabilization is provided by operating at an off-resonant frequency. As discussed above, with reference to FIG. 2 and FIG. 4, the desired frequency may be either below or above the resonant frequency, depending on the sign of dR/dP, as seen by the RF generator. For example, the frequency will be above resonance when operating on the upper branch of the power curve in FIG. 4, and below resonance when operating on the lower branch.

One advantage of off-resonance frequency control is excellent analog stability. There may be a disadvantage of stress on FET switching transistors. This may reduce the maximum degree of off-resonance operation.

Figure 11:
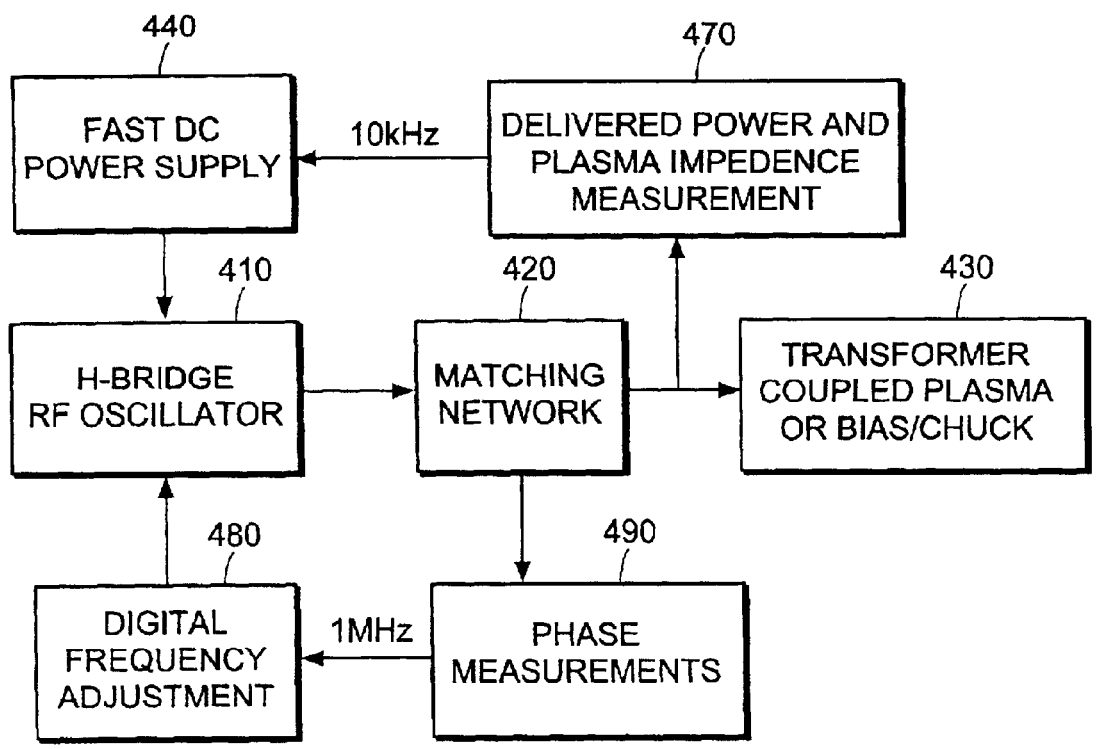
FIG. 11 is a block diagram that illustrates an embodiment of a RF plasma generator that includes DC power supply control with two loops.

DC Power Supply Control—Referring to FIG. 11, a schematic diagram illustrates an embodiment employing DC power supply control with two loops. The embodiment includes an H-bridge RF oscillator 410 (i.e., a generator), a matching network 420 and a load 430, for example, a chuck or an inductively coupled plasma, Phase information 490 is feed via a digital frequency adjuster 480 to the oscillator 410. Matching network output power and load or plasma impedance information 470 are delivered to a fast DC power supply 440, which supplies the oscillator 410.

The frequency may be maintained close to resonance by a PLL or other digital phase measurement means. The RF voltage and current is monitored to enable determination of forward and reflected power. The DC power supply is designed to allow fast control, with a loop bandwidth of at least 1 kHz and preferably 5–10 kHz. Modulation of the DC bus voltage provides power leveling.

In an alternative embodiment, a small amplitude sinusoidal signal is impressed on the DC supply. This may cause amplitude modulation of the RF voltage. The sign of dR/dP may be determined via, for example, lock-in amplifier techniques. This information may be used to control either the DC supply or the RF frequency.

In a further embodiment, the RF frequency may be modulated. The plasma response may be measured, for example, via lock-in amplifier techniques. This information may be used in conjunction, for example, with the graph of FIG. 4 to enable determination of the operating point. This embodiment may permit determination of the sign of dR/dP, and to determine whether operation is currently on the upper or lower branch of the power curve.

Figure 12:
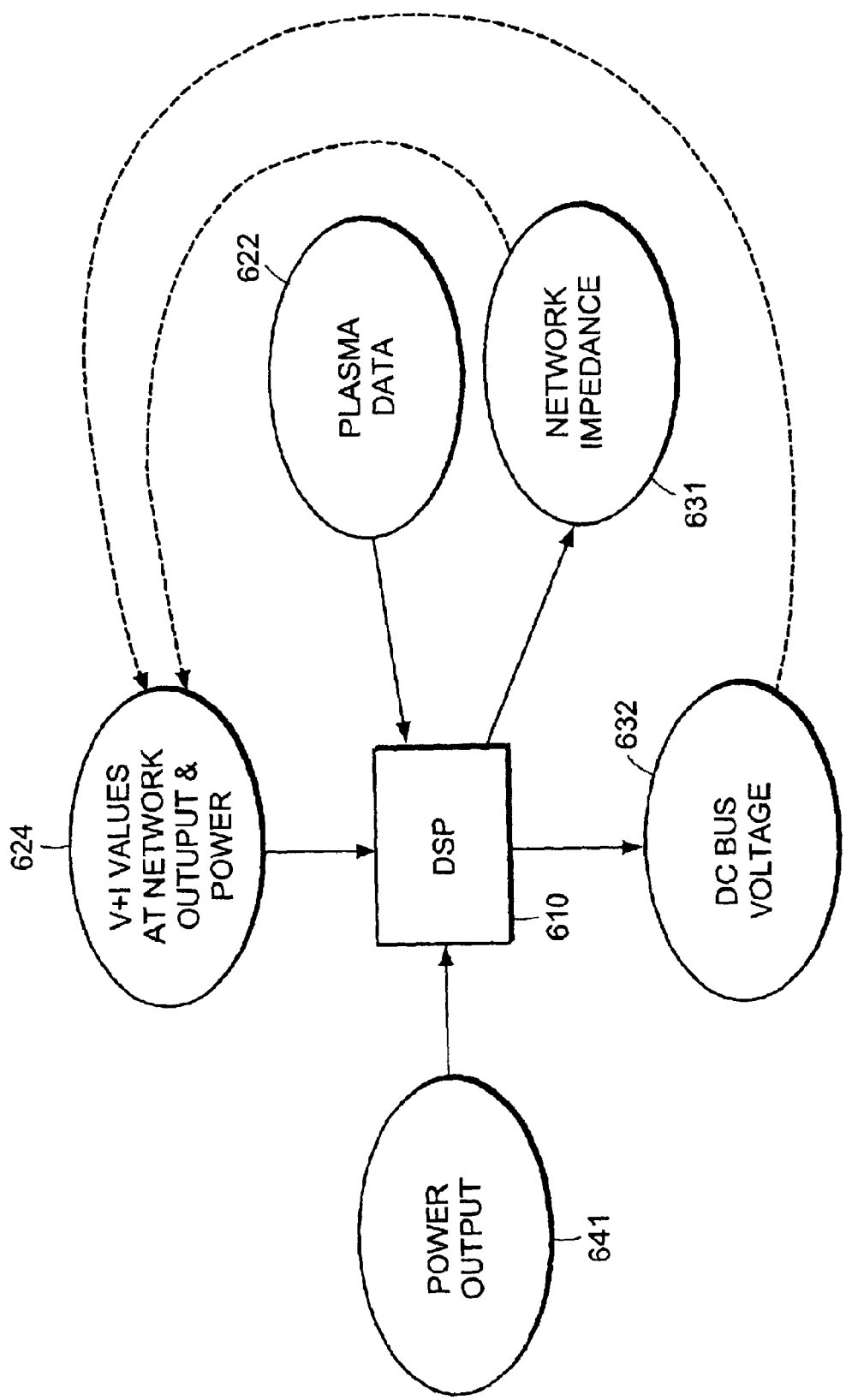
FIG. 12 is a block diagram that illustrates data control flow in one embodiment of a RF plasma generator.

Referring to FIG. 12, some embodiments employ a DSP to control a DC bus in response to system parameters, to stabilize a plasma The diagram of FIG. 12 illustrates data control flow in one embodiment. A DSP 610 receives as data the values of RF voltage, current and delivered power 621, obtained at the output of a matching network. Delivered power data may be calculated as described in the following section. The DSP 610 may also receive a plasma diagnostic signal 622, for example, via detection of light emission.

A user may provide power selection value 641 to the DSP 610. The DSP may further control the variable matching network impedance 631. Changes in DC bus voltage 632 and/or network impedance generally will lead to changes in the measured and calculated values 621.

In one embodiment, the DSP responds to changes in the load by adjusting a DC supply 632 to maintain constant delivered power. In another embodiment, the DSP further takes into account the time derivatives of one or more measured parameters.

Metrology for Network Control—Some embodiments utilize metrology of system parameters in support of a variable impedance matching network. Some of these embodiments include measurement of RF current and voltage between the RF generator output and the matching network input. These measures are advantageous because the current and voltage here are in phase, and thus provide an accurate measure of RF power. Further, RF current or voltage may be measured between the network output and the load input.

Figure 13A:
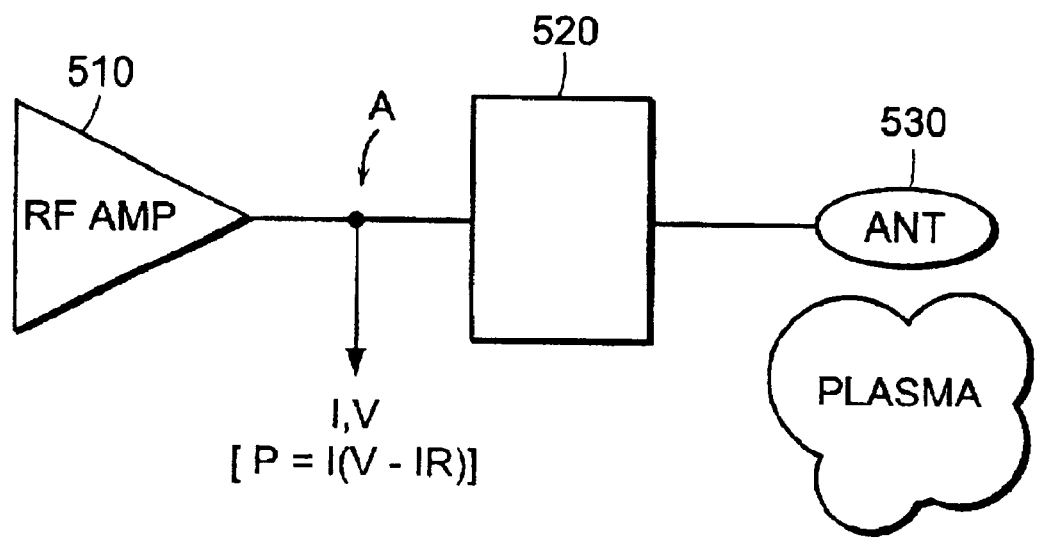
FIG. 13a is a block diagram that illustrates an embodiment of a plasma processing system that supplies power to an antenna.

Referring to FIG. 13a, an embodiment of a system supplying an antenna coil is illustrated. An RF amplifier 510 supplies an antenna 530 via a matching network 520. The matching network 520 may include a variable or fixed capacitor. Matching losses may be small, arising from series resistance of the capacitor in the matching network 520. Hence, measuring current and voltage at location A, between the RF amplifier output and the matching network input, provides an accurate measure of power delivered to the antenna 530. Power may be calculated via use of the equation:

$$P=I(V-Ir);$$

where I and V are the RF current and voltage measured between the RF supply output and the matching network input, and r is the series resistance of the capacitor in the network 520.

Figure 13B:
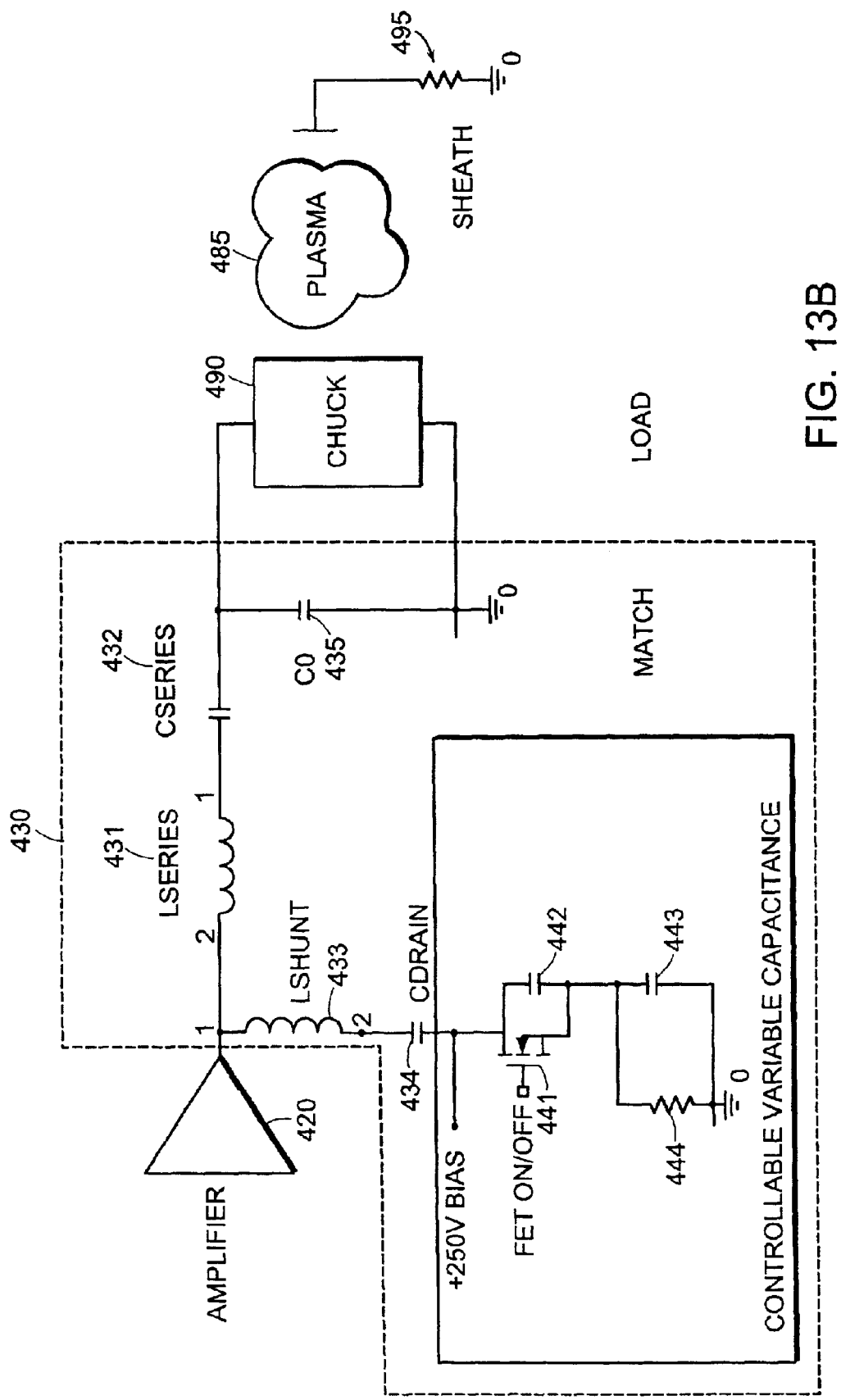
FIG. 13b is a block diagram that illustrates an embodiment of a plasma processing system that supplies power to a chuck.

Referring to FIG. 13b, an embodiment of a system that supplies a chuck 410 is illustrated. An RF amplifier 420 supplies a chuck 410 via a matching network 430. The matching network 430 includes an L-rnatch portion. The L-match portion includes a series inductor 431, for example, of value 300 nH, and a series capacitor 432 that includes one or more capacitors, for example, variable with value in a range of 10–500 pF. The L-match also includes a shunt inductor 433, for example, of value 400 nH, and a shunt capacitor 434, for example, variable with value in a range of 15–1000 pF.

The shunt capacitor 434 of the L-match portion is electrically connected to a positive DC bias voltage source of, for example, +250V, and further to an FET switch 441. The positive bias value is chosen so that the FET switch is not reverse biased nor is its maximum voltage rating exceeded when operating at maximum RF voltage. The FET switch 441 is in parallel with a capacitor 442. A further capacitor 443 and a resistor 444 are in parallel, and electrically located between ground and the FET switch 441. The series capacitor 432 of the L-match is electrically connected to the chuck 490. A ground capacitor 435 is in parallel with the chuck 490, and connected to ground. A plasma 485 develops in the chamber of a plasma processing tool, which may include a sheath that provides a resistive path 495 to ground.

Various embodiments that include the above-described matching network make use of metrology of system parameters. The metrology supports system adjustment to maintain good plasma performance. The below metrology method is employed in one embodiment:

1) Calibrate a RF supply unit by first connecting a known load, e.g., a load similar to one planned for use in a plasma processing system, to the match output.
2) Deliver a moderate power to the load at a known frequency, of. Determine the power delivered to the load, e.g., by electrical measurement or by calorimetry.
3) Measure I1 and V1 at the output of the RF amplifier and Vout at the output of the match.
4) The product (I1×V1) provides the output power of the RF amplifier.
5) Knowledge of V1 in combination with a model for the shunt leg of the match network allows an estimate of shunt losses. The shunt model may have two or more adjustable parameters.
6) Knowledge of (V1−Vout) in combination with a model for the series leg of the match network allows an estimate of the series losses. The series model may have two or more adjustable parameters.
7) Conservation of energy requires Pload=Pamp+Pshunt+Pseries
8) Repeat steps 2–7 at several power levels and frequencies to find best-fit values for the adjustable parameters in the series and shunt models.
9) If necessary, measure the temperature of the ferrite inductors and include in the shunt and series models.
10) In service, the load will not be known. The known quantities will be I1, V1, Vout and (possibly) the temperatures of the ferrite inductors. The power delivered to the load will be Pload=Pamp−Pshunt−Pseries, where Pseries and Pshunt are fictions of the known quantities.

In one embodiment, the model for the series or shunt leg is:

$$P=AV^2[f^2/(1-f^2/f_0^2)^2+e/f^2],$$

where: V is the voltage across the leg; f is the frequency; f0 is the LC resonant frequency of the leg; and A and e are constants proportional to the losses at the fundamental and at higher harmonics, which will be determined by a least square fit These constants are also slightly temperature dependent over the expected inductor temperature range from 20–60° C. A temperature correction can be added for additional accuracy. Generally, current and voltage in the system will not have pure sinusoidal waveforms, and will include some higher harmonics.

Table I and Table II show calculated losses for some matching network components, as for an example of an implementation of the above-described embodiment. Table I shows data for a low capacitance (i.e. high power) load with the FET switch on.

TABLE I

| Freq (MHz) | DC PS (V) | Power In (W) | Plasma Load (W) | Lshunt Loss (W) | Lseries Loss (W) | FET Loss (W) | Efficiency (%) |
|---|---|---|---|---|---|---|---|
| 13.66 | 110 | 1680 | 1220 | 55 | 215 | 110 | 73 |
| 13.23 | 100 | 680 | 520 | 24 | 50 | 50 | 77 |
| 13.23 | 170 | 1970 | 1500 | 70 | 150 | 140 | 77 |

Table II shows data for a high capacitance (i.e. low power) load with the FET switch off.

TABLE II

| Freq (MHz) | DC PS (V) | Power In (W) | Plasma Load (W) | Lshunt Loss (W) | Lseries Loss (W) | FET Loss (W) | Efficiency (%) |
|---|---|---|---|---|---|---|---|
| 13.71 | 100 | 135 | 100 | 5 | 12 | 5 | 74 |
| 13.71 | 175 | 410 | 312 | 15 | 40 | 15 | 76 |

Figure 14:
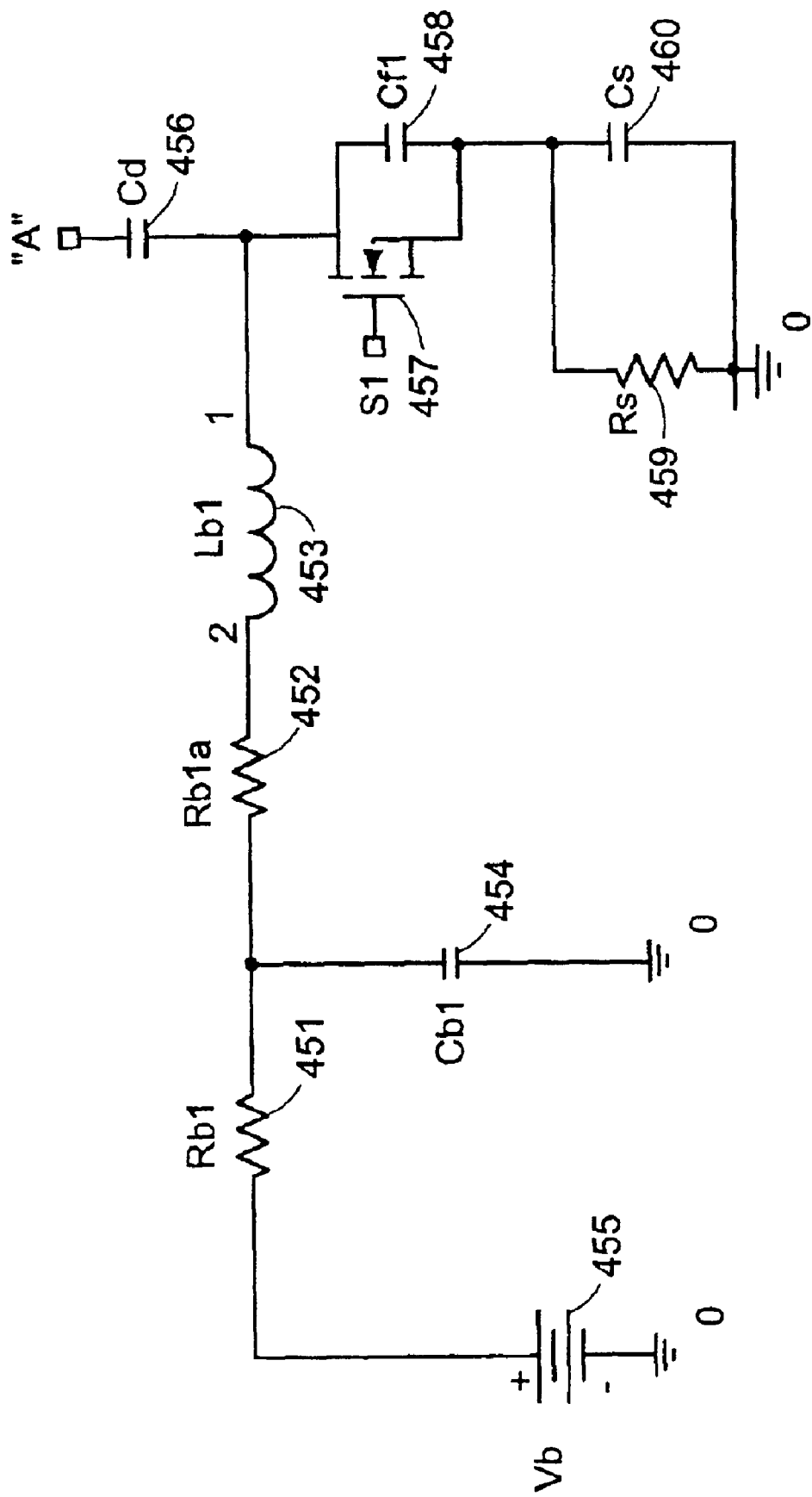
FIG. 14 is a block diagram that illustrates an embodiment of a smooth switching matching network.

Smooth Switching Match System—Referring to FIG. 14, a smooth switch portion, included in a matching network, enables addition or removal of capacitance from the matching network. The smooth switch portion may provide a smooth change to a matching resonant frequency during application of RF power to a load.

One embodiment of a smooth switch portion is illustrated by the schematic diagram of FIG. 14. The smooth switch portion interfaces to the remainder of a network at node "A". The smooth switch portion includes: capacitor Cd 456, bias capacitor Cb1 454, capacitor Cf1 458 and source capacitor Cs 460; RF choke inductor Lb1 453; bias resistors Rb1 451 and Rb1a 452; source resistor Rs 459; bias voltage supply Vb 455; and FET switch S1 457. When FET S1 457 is held to ground, the FET is off, and the capacitance seen at node "A" is the series combination of Cd, Cf1, the FET output capacitance and Cs. Cs may be selected to have much larger capacitance than any other capacitance, and so may have negligible effect.

Figure 15:
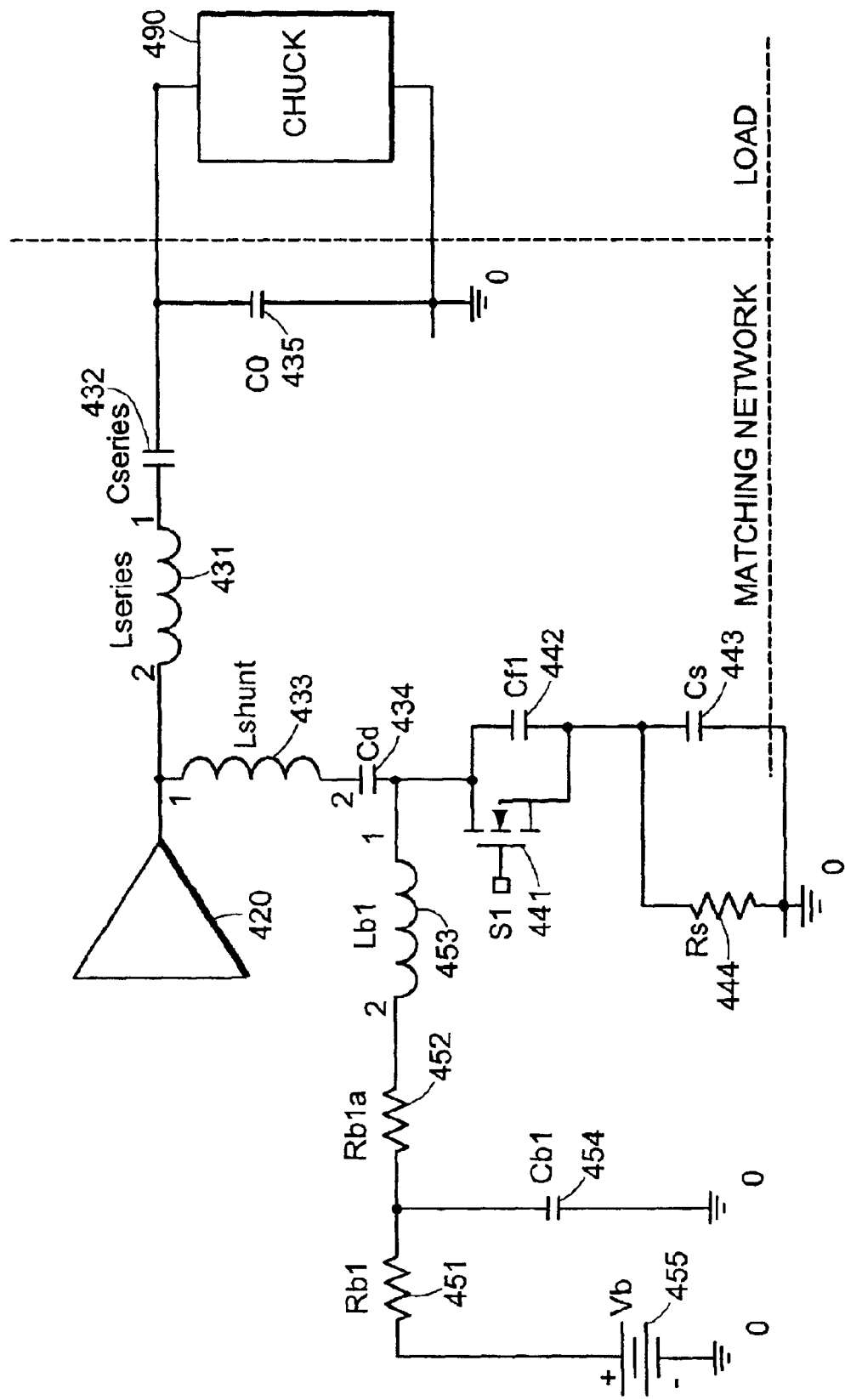
FIG. 15 is a block diagram that illustrates an embodiment of a plasma processing system that includes the smooth switch portion of FIG. 14.

Referring to FIG. 15, the above-described smooth switch portion is shown implemented in a plasma system that is otherwise similar to the embodiment illustrated with reference to FIG. 13b.

When the FET is on, the capacitance seen at node "A" is approximately Cd. The combination of the bias circuit and the source resistor Rs determine the transition time between these two states, i.e., when the FET is on and when the FET is off. The FET may be slowly turned on and off by controlling the gate to source voltage.

Figure 16A:
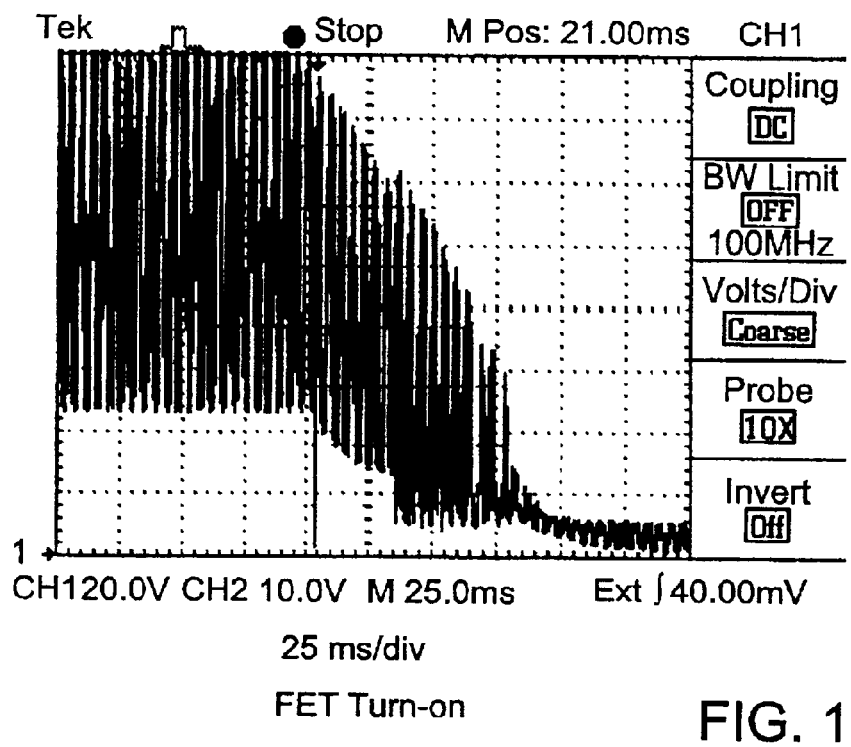
FIG. 16a is a graph that illustrates the RF transition behavior for FET switching, in one embodiment.
Figure 16B:
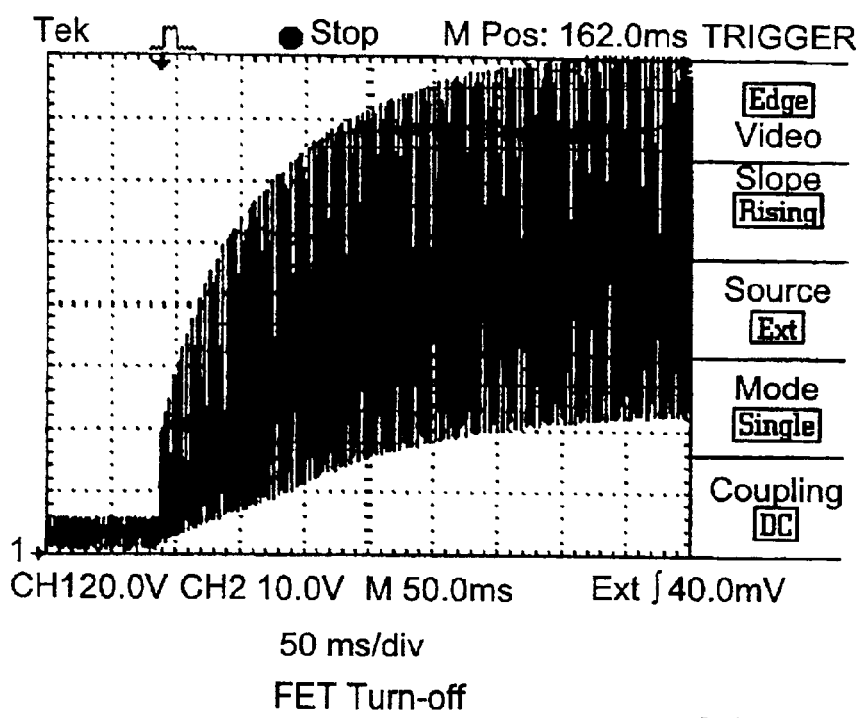
FIG. 16b is a graph that illustrates the RF transition behavior for FET switching, in one embodiment.

Referring to FIGS. 16a and 16b, the transition behavior may be illustrated by observing network behavior after turning the FET switch on or off. The graphs shown in FIGS. 16a and 16b were collected using a network that included components with the following values: Vb=100 V; Rb1=36 kohm; Rb2=2.2 kohm; Cb1=3 uF; Lb1=100 uF; Rs=2.2 kohm; Cs=0.1 uF; RF frequency=13.56 MHz; and RF amplitude=60 V.

FIG. 16a shows smooth FET turn-on reducing the drain voltage, and increasing the capacitance at node "A", during a transition time of 75 msec. The curve illustrates an RF envelope. FIG. 16b shows smooth FET turn-off increasing the drain voltage, and decreasing the capacitance at node "A", during a transition time of 300 msec. The curve again illustrates the RF envelope.

Figure 17:
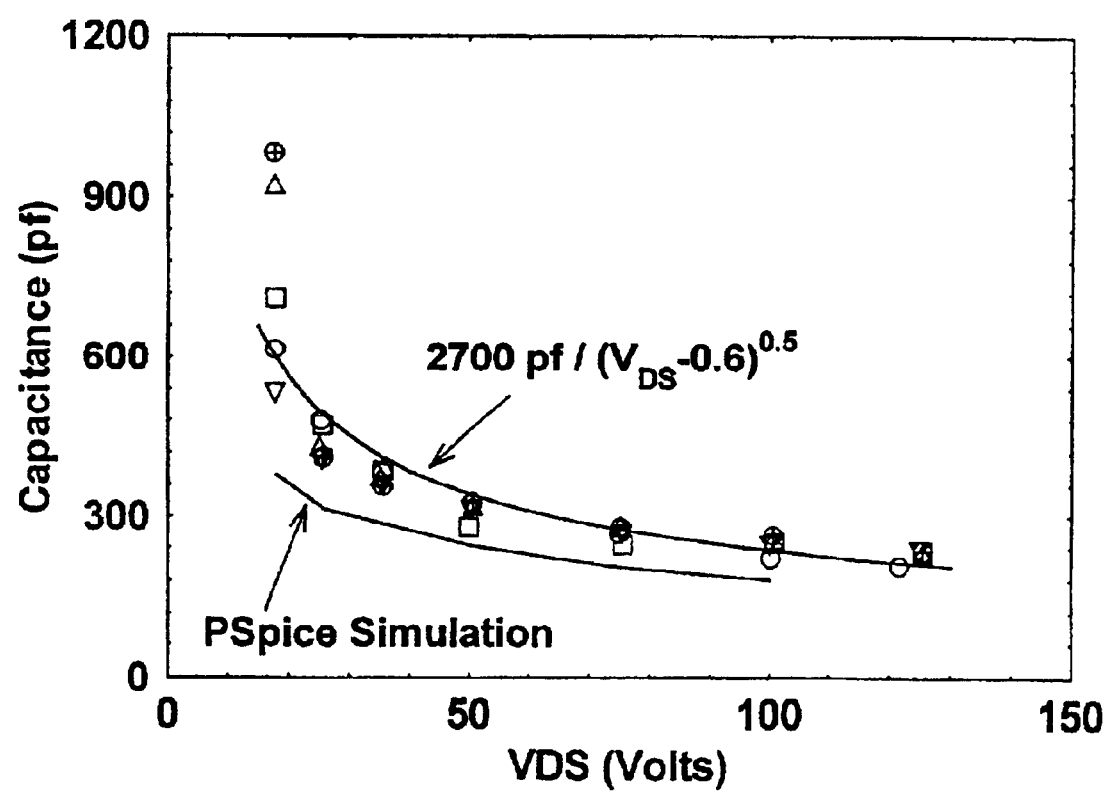
FIG. 17 is a graph of capacitance versus drain-to-source voltage that illustrates the electrical performance of a FET in one embodiment.

A high power FET is employed in a preferred embodiment. One such FET is the model 10090BLLX FET available from Advanced Power Technology (APT) of Bend, Oregon. Referring to FIG. 17, a graph of capacitance versus drain-to-source voltage ("$V_{DS}$") illustrates the electrical performance of this FET. The graph shows plotted points for five FET samples (i.e., measured values), an upper curve that was theoretically calculated and a lower curve that was derived from a Pspice simulation.

The upper, theoretical curve was obtained with the below equation, and calculated for a half-step junction with a potential of 0.6 volts and a main capacitor ($C_0$) obtained from a least-square fit.

$$C(V_{DS})=C_0/(1+VDS/0.6)^{0.5}$$

The graph indicates that a bias greater than 75 volts may be required to preserve a relatively flat capacitance. An additional shunt capacitor, several times greater than the output capacitor, may be added between the source and drain to further reduce the sensitivity to bias voltage and component variability.

Figure 18:
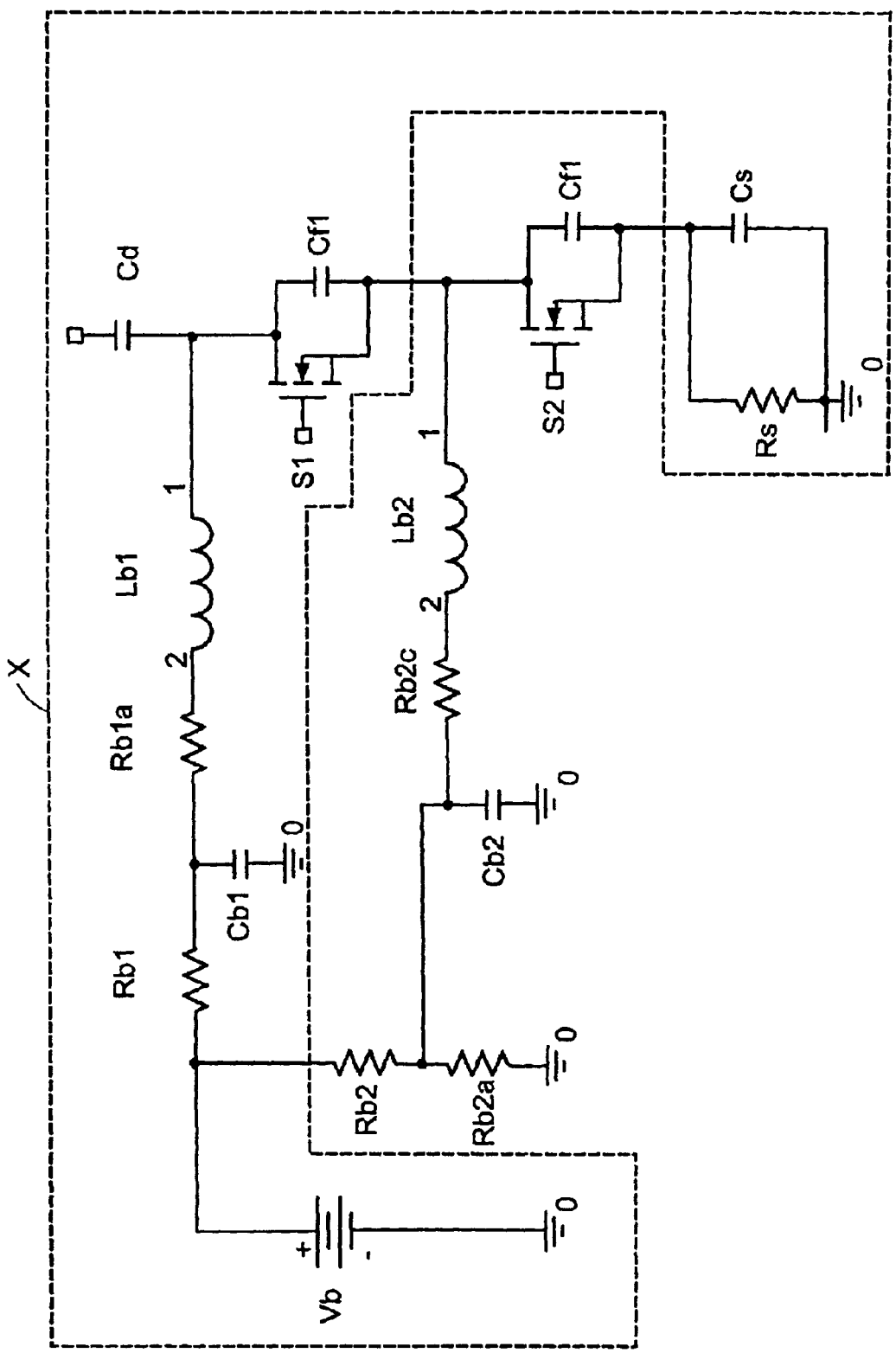
FIG. 18 is a schematic diagram of one embodiment that includes multiple smooth switch portions.

Referring to FIG. 18, a further embodiment includes multiple smooth switch portions. This embodiment may provide an increase in the matching frequency range. An embodiment that includes two smooth switch portions in series is illustrated by the schematic diagram of FIG. 18. A first smooth switch portion that is similar to the embodiment illustrated in FIG. 14 is enclosed with dashed box X. A second portion provides a second FET S2 in series with the FET S1 of the first portion.

The embodiment of FIG. 18 does not add high-frequency parasitic resonances to the network. Selection of capacitors Cd, Cf1 and Cf2 may provide four resonant frequencies that corresopnd to the four combinations of S1 and S2 switch values.

Other embodiments include smooth switch portions added in parallel. Generally, more portions may be added in parallel than in series due to biasing requirements. Parallel configuration, however, may introduce parasitic resonances at high frequency.

Alternative embodiments of a smooth switch portion may include the same configuration of components as described above, though operated in a different fashion. These alternative embodiments may provide a continuously variable capacitance at port "A". In these embodiments, the FET is operated as a voltage-controlled varactor while in an off state (i.e., gate to source voltage below a threshold voltage). That is, the FET is a variable capacitor, responsive to changes in voltage.

Referring again to FIG. 17, the drain-source capacitance of the FET depends strongly on the bias voltage Vb. By controlling the bias, the capacitance at port "A" may be varied, for example, to maintain a match with a resonance condition. This embodiment may be included in a feedback loop control circuit, in which the bias voltage is controlled by a control system. The control system monitors the output phase of the voltage and current signals presented to the match, and may vary the bias voltage, and thereby the match network capacitance, to maintain the signals in phase.

In one embodiment of a plasma system, the resonant condition is maintained by controlling only the frequency when the FET is on, and the resonant condition is maintained by controlling both the frequency and the FET capacitance when the FET is off.

Equivalents

Wile the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An RF plasma generator comprising:
 a) a variable frequency RF generator, comprising an RF output, that generates electromagnetic radiation having a power;
 b) a matching network comprising at least one variable impedance component, the matching network including a first port that is electromagnetically coupled to the output of the RF generator and a second port, the variable impedance component providing an electrically controllable variable capacitance;
 c) a load that is electromagnetically coupled to the second port of the matching network; and
 d) a plasma chamber for containing a plasma having a power, the plasma chamber being electromagnetically coupled to the load, the plasma chamber receiving electromagnetic radiation having a power from the load, wherein
 adjusting at least one of the frequency of the RF generator and the variable impedance component in the matching network changes the power in the plasma.

2. The RF plasma generator of claim 1 wherein the load is reactive.

3. The RF plasma generator of claim 1 wherein the matching network transforms the impedance of the reactive load to a substantially real impedance.

4. The RF plasma generator of claim 1 wherein the load comprises an inductive load.

5. The RF plasma generator of claim 1 wherein the load comprises a capacitive load.

6. The RF plasma generator of claim 1 wherein the adjusting the at least one of the frequency of the RF generator and the variable impedance component in the matching network substantially matches an impedance of the load to an output impedance of the RF generator.

7. The RF plasma generator of claim 1 wherein the adjusting the at least one of the frequency of the RF generator and the variable impedance component in the matching network increases the power in the plasma.

8. The RF plasma generator of claim 1 wherein the matching network has a substantially resistive impedance at a frequency of the electromagnetic radiation.

9. The RF plasma generator of claim 1 wherein the matching network comprises a series combination of an amplifier and a variable capacitance capacitor.

10. The RF plasma generator of claim 1 wherein the RF generator and the matching network are physically integrated in a device housing.

11. The RF plasma generator of claim 1 further comprising a sensor that measurers power delivered to the load.

12. The RF plasma generator of claim 1 wherein the at least one of the frequency of the RF generator and the variable impedance component in the matching network is adjusted in response to a measurement of the sensor.

13. The RF plasma generator of claim 12 wherein the at least one of the frequency of the RF generator and the variable impedance component in the matching network is adjusted to minimize power reflected from the plasma.

14. The RF plasma generator of claim 12 wherein the at least one of the frequency of the RF generator and the variable impedance component in the matching network is adjusted to maximize power reflected from the plasma.

15. The RF plasma generator of claim 1 wherein the plasma has a power that is related to the power of the electromagnetic radiation that is coupled from the load to the plasma.

16. The RF plasma generator of claim 1 wherein the matching network comprises switching transistors.

17. An RF plasma generator comprising:
 a) an RF generator including an RF output that generates electromagnetic radiation at a frequency;
 b) a matching network comprising a 3-port solid state device that electrically controls a change of a capacitance of a component in the matching network, an impedance of the matching network being substantially resistive at the frequency of the RF electromagnetic radiation, the matching network including a first port that is electromagnetically coupled to the output of the RF generator and a second port;
 c) a load that is electromagnetically coupled to the second port of the matching network; and
 d) a plasma chamber for containing a plasma therein, the plasma chamber being electromagnetically coupled to the load.

18. An RF plasma generator comprising:
 a) an RF generator, comprising an RF output, that generates electromagnetic radiation having a power;
 b) a matching network comprising a series combination of an amplifier and an electrically controllable variable capacitance capacitor, the matching network including a first port that is electromagnetically coupled to the output of the RF generator and a second port;
 c) a load that is electromagnetically coupled to the second port of the matching network; and
 d) a plasma chamber for containing a plasma having a power, the plasma chamber being electromagnetically coupled to the load, the plasma chamber receiving electromagnetic radiation having a power from the load, wherein
 adjusting at least one of the frequency of the RF generator and the variable impedance component in the matching network changes the power in the plasma.

19. An RF plasma generator comprising:
 a) a variable frequency RF generator including an RP output that generates an RF signal having a power,
 b) a matching network comprising at least one variable impedance component and a 3-port solid state device that electrically controls a change of a capacitance of a component in the matching network, the matching network including a first port that receives the RF signal and a second port;

c) a load that is electrically coupled to the second port of the matching network; and d) a plasma chamber for containing a plasma having a power, the plasma chamber being electromagnetically coupled to the load via the RF signal, wherein adjusting at least one of the frequency of the RF generator and the variable impedance component in the matching network changes the power in the plasma.

20. An RF plasma generator comprising:

a) a variable frequency RF generator, comprising an RF output, that generates electromagnetic radiation having a power;

b) a matching network comprising at least one variable impedance component, the matching network including a first port that is electromagnetically coupled to the output of the RF generator and a second port, the variable impedance component providing an electrically controllable variable impedance;

c) a load that is electromagnetically coupled to the second port of the matching network; and d) a plasma chamber for containing a plasma having a power, the plasma chamber being electromagnetically coupled to the load, the plasma chamber receiving electromagnetic radiation having a power from the load, wherein adjusting at least one of the frequency of the RF generator and the variable impedance component in the matching network changes the power in the plasma.

21. The RF plasma generator of claim 20 wherein the variable impedance component comprises a variable capacitance component.

* * * * *

UNITED STATES PATENT AND TRADEMARK OFFICE
CERTIFICATE OF CORRECTION

PATENT NO.    : 6,887,339 B1
DATED         : May 3, 2005
INVENTOR(S)   : Goodman et al.

It is certified that error appears in the above-identified patent and that said Letters Patent is hereby corrected as shown below:

<u>Column 20,</u>
Line 5, please replace "measurers" with -- measures --
Line 60, please replace "RP" with -- RF --

<u>Column 21,</u>
Line 3, after "chamber" please replace "fbr" with -- for --

Signed and Sealed this

Nineteenth Day of July, 2005

JON W. DUDAS
*Director of the United States Patent and Trademark Office*